(12) United States Patent
Yamatani

(10) Patent No.: US 11,563,187 B2
(45) Date of Patent: Jan. 24, 2023

(54) NITROGEN-CONTAINING COMPOUND-CONTAINING COMPOUND AND ORGANIC ELECTROLUMINESCENCE DEVICE INCLUDING THE SAME

(71) Applicant: SAMSUNG DISPLAY CO., LTD., Yongin-si (KR)

(72) Inventor: Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 283 days.

(21) Appl. No.: 16/042,414

(22) Filed: Jul. 23, 2018

(65) Prior Publication Data

US 2019/0148652 A1  May 16, 2019

(30) Foreign Application Priority Data

Nov. 15, 2017 (KR) .......................... 10-2017-0152588

(51) Int. Cl.
*H01L 51/50* (2006.01)
*H01L 51/00* (2006.01)
(Continued)

(52) U.S. Cl.
CPC ........ *H01L 51/0094* (2013.01); *C07F 7/0816* (2013.01); *C09K 11/06* (2013.01);
(Continued)

(58) Field of Classification Search
None
See application file for complete search history.

(56) References Cited

U.S. PATENT DOCUMENTS

2017/0186962 A1* 6/2017 Ren ..................... H01L 51/0054
2017/0263871 A1* 9/2017 Wang ..................... H05B 33/20
2018/0205019 A1* 7/2018 Fuchiwaki .......... H01L 51/0094

FOREIGN PATENT DOCUMENTS

CN 105399696 A 3/2016
JP 5724588 B2 5/2015
(Continued)

OTHER PUBLICATIONS

Jin Won Sun et al., "Thermally Activated Delayed Fluorescence from Azasiline Based Intramolecular Charge-Transfer Emitter (DTPDDA) and a Highly Efficient Blue Light Emitting Diode", Chem. Mater., 2015, 27 (19), pp. 6675-6681.

*Primary Examiner* — Gregory D Clark
(74) *Attorney, Agent, or Firm* — Lewis Roca Rothgerber Christie LLP

(57) ABSTRACT

A nitrogen-containing compound is represented by the following Formula 1

[Formula 1]

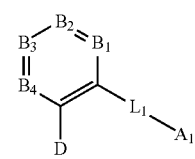

where $B_1$ to $B_4$ are each independently N or $CR_1$, $A_1$ is an electron accepting group, L1 and R1 are further defined, and D is an electron donating group represented by the following Formula 2

[Formula 2]

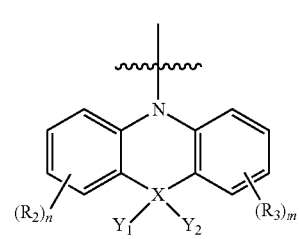

X is Si or Ge and Y1, Y2, R2, R3, n and m are further defined. An organic electroluminescence device includes the nitrogen-containing compound.

16 Claims, 2 Drawing Sheets

(51) Int. Cl.
*C07F 7/08* (2006.01)
*C09K 11/06* (2006.01)
(52) U.S. Cl.
CPC ...... *H01L 51/0059* (2013.01); *H01L 51/0067* (2013.01); *C09K 2211/1018* (2013.01); *H01L 51/0071* (2013.01); *H01L 51/0072* (2013.01); *H01L 51/5012* (2013.01)

(56) References Cited

FOREIGN PATENT DOCUMENTS

| | | | |
|---|---|---|---|
| JP | 2016-036022 A | 3/2016 |
| KR | 10-2017-0037135 A | 4/2017 |
| KR | 10-1769764 B1 | 8/2017 |
| WO | WO 2012/149999 A1 | 11/2012 |
| WO | WO 2014/034535 A1 | 3/2014 |
| WO | WO 2016/017684 A1 | 2/2016 |
| WO | WO 2016/042070 A1 | 3/2016 |
| WO | WO 2016/116504 A1 | 7/2016 |
| WO | WO 2016/159479 A1 | 10/2016 |

* cited by examiner

NITROGEN-CONTAINING COMPOUND-CONTAINING COMPOUND AND ORGANIC ELECTROLUMINESCENCE DEVICE INCLUDING THE SAME

CROSS-REFERENCE TO RELATED APPLICATIONS

Korean Patent Application No. 10-2017-0152588, filed on Nov. 15, 2017, in the Korean Intellectual Property Office, and entitled: "Nitrogen-Containing Compound-Containing Compound and Organic Electroluminescence Device Including the Same," is incorporated by reference herein in its entirety.

BACKGROUND

1. Field

Embodiments relate to a nitrogen-containing compound and an organic electroluminescence device including the same.

2. Description of the Related Art

Development on organic electroluminescence displays as an image display is being actively conducted. An organic electroluminescence display is different from a liquid crystal display in that an organic electroluminescence display is a self-luminescent display that accomplishes display by recombining holes and electrons injected from a first electrode and a second electrode in an emission layer and emitting light from a luminescent material which includes an organic compound in the emission layer.

In an application of an organic electroluminescence device to a display, decrease of a driving voltage, increase of emission efficiency and extension of life for the organic electroluminescence device are required, and development of materials which may stably implement these requirements in the organic electroluminescence device is also continuously required.

In particular, development on phosphorescence emission using triplet state energy or delayed fluorescence emission using triplet-triplet annihilation (TTA) in which singlet excitons are generated by the collision of triplet excitons is being conducted recently for achieving a high efficiency organic electroluminescence device. In addition, thermally activated delayed fluorescence (TADF) materials using delayed fluorescence phenomenon are being developed.

SUMMARY

Embodiments are directed to a nitrogen-containing compound represented by the following Formula 1:

[Formula 1]

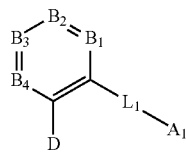

wherein in Formula 1, $B_1$ to $B_4$ are each independently N or $CR_1$, $R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group having 2 to 30 ring carbon atoms, $L_1$ is a direct linkage, a substituted or unsubstituted arylene group having 6 to 50 ring carbon atoms, or a substituted or unsubstituted heteroarylene group having 2 to 50 ring carbon atoms, $A_1$ is an electron accepting group, D is an electron donating group represented by the following Formula 2:

[Formula 2]

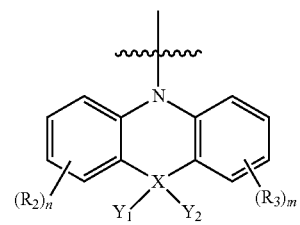

wherein in Formula 2, X is Si or Ge, $Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms, $R_2$ and $R_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and n and m are each independently an integer of 0 to 4.

$A_1$ may be a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or represented by the following Formula 3:

[Formula 3]

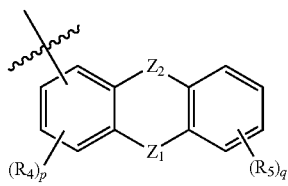

wherein in Formula 3,
$Z_1$ is —SO—, —SO$_2$—, —BR$_6$—,

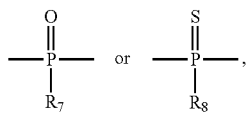

$Z_2$ is O, S, or NAr,

Ar is a substituted or unsubstituted aryl group having 6 to 30 ring carbon atoms, or a substituted or unsubstituted heteroaryl group having 2 to 30 ring carbon atoms, $R_6$ to $R_3$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, $R_4$ and $R_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

The nitrogen-containing compound represented by Formula 1 may be a nitrogen-containing compound represented by the following Formula 1-1:

[Formula 1-1]

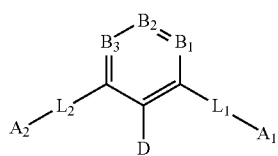

wherein Formula 1-1, $L_2$ is a direct linkage, a substituted or unsubstituted arylene group having 6 to 50 ring carbon atoms, or a substituted or unsubstituted heteroarylene group having 2 to 50 ring carbon atoms, $A_2$ is an electron accepting group, and $B_1$ to $B_3$ and D are the same as defined above.

$A_2$ may be a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or represented by the following Formula 3:

[Formula 3]

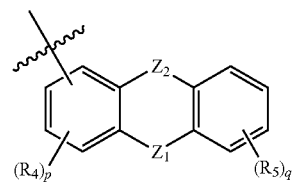

wherein in Formula 3, $Z_1$ is —SO—, —SO$_2$—, —BR$_6$—,

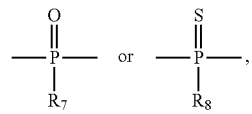

$Z_2$ is O, S, or NAr, Ar is a substituted or unsubstituted aryl group having 6 to 30 ring carbon atoms, or a substituted or unsubstituted heteroaryl group having 2 to 30 ring carbon atoms, $R_6$ to $R_8$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, $R_4$ and $R_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

$Y_1$ and $Y_2$ may each independently be a substituted or unsubstituted phenyl group, or a substituted or unsubstituted isopropyl group.

$Y_1$ and $Y_2$ may be the same as each other.

$A_1$ may be a cyano group, or a fluorine atom, or a group represented by any one of the following formulae:

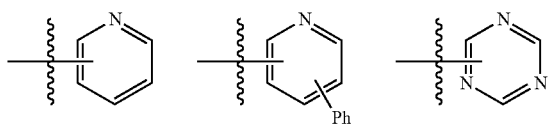

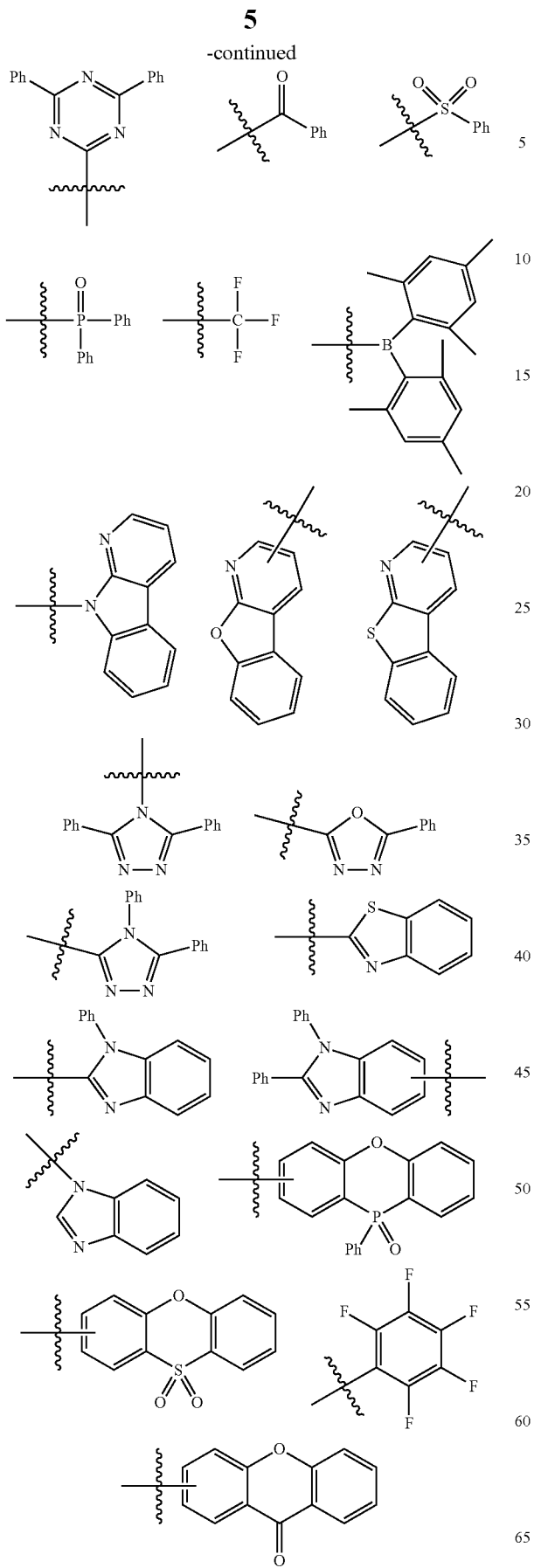
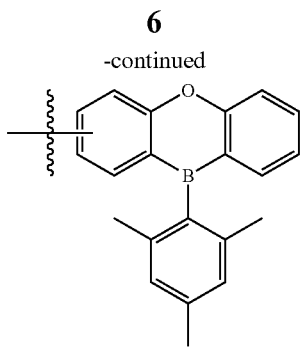

where Ph indicates a phenyl group.

$A_1$ may be a substituted or unsubstituted triazine group, or a substituted or unsubstituted carbonyl group.

$L_1$ may be a direct linkage, a substituted or unsubstituted phenylene group, or a substituted or unsubstituted divalent biphenylene group.

The number of N in $B_1$ to $B_4$ may be 0 or 1.

The nitrogen-containing compound represented by Formula 1 may have an absolute value of the difference between the lowest excitation singlet energy level (S1) and the lowest excitation triplet energy level (T1) of about 0.2 eV or less.

The nitrogen-containing compound represented by Formula 1 may be a compound selected from the following Compound Group 1:

[Chemical Group 1]

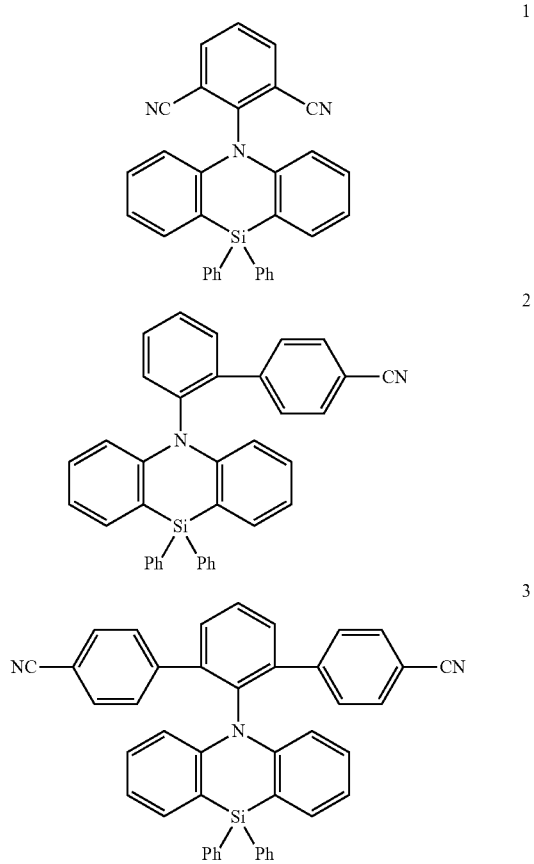

-continued
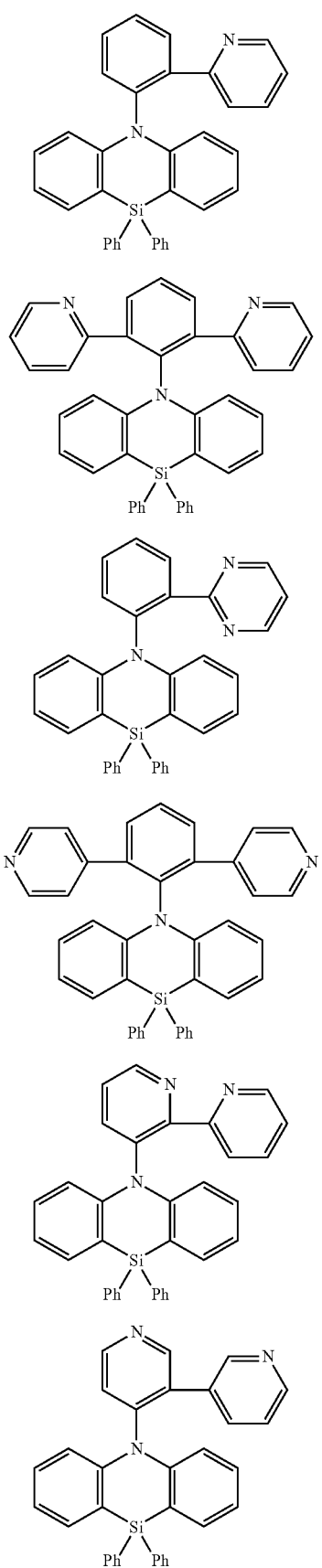
4
5
6
7
8
9
-continued
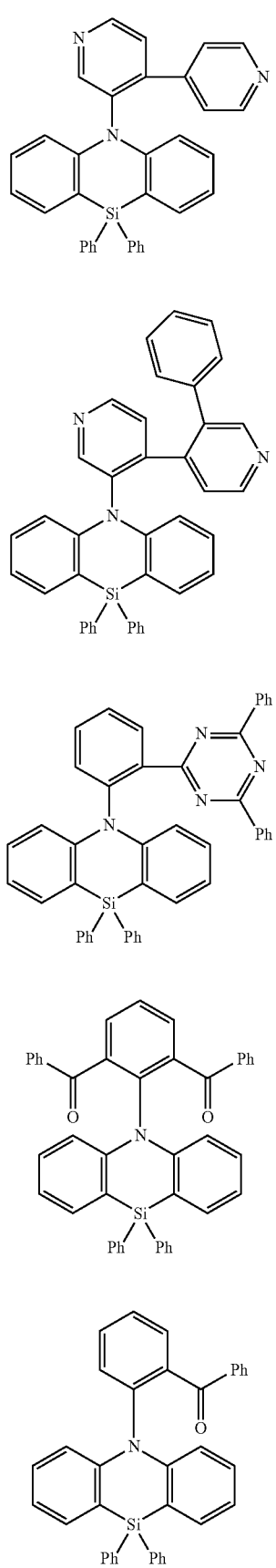
10
11
12
13
14

15
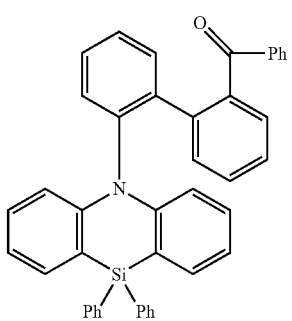
16
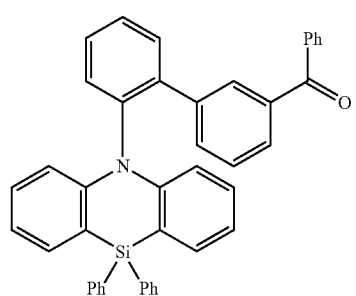
17
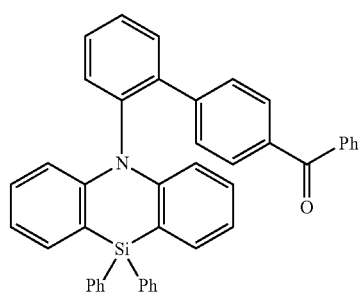
18
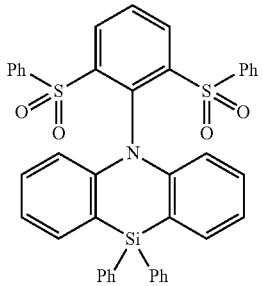
19
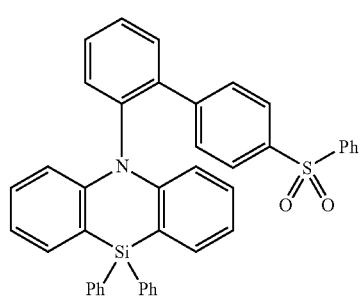
20
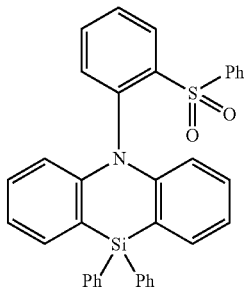
21
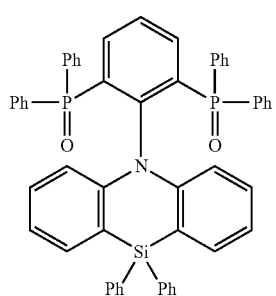
22
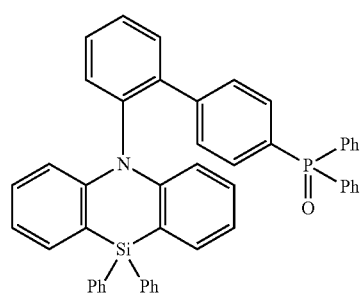
23
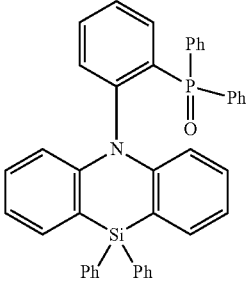
24
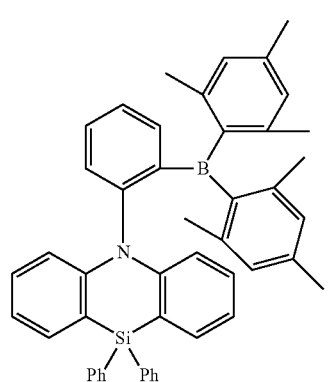

11
-continued
25
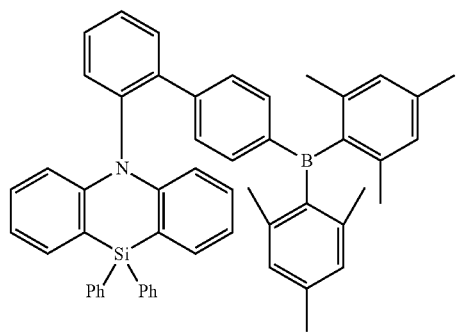
26
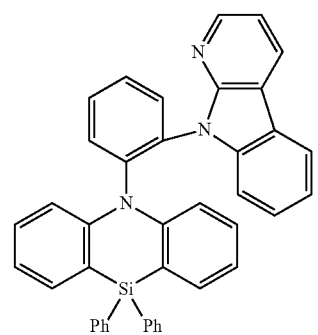
27
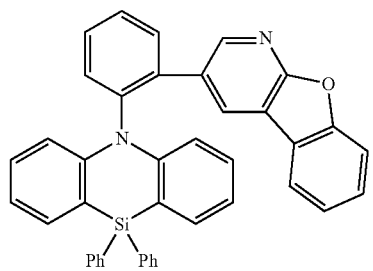
28
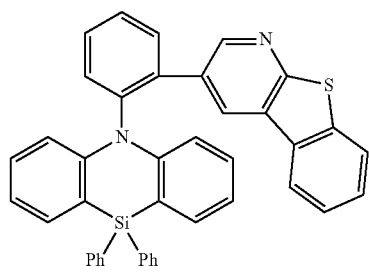
29
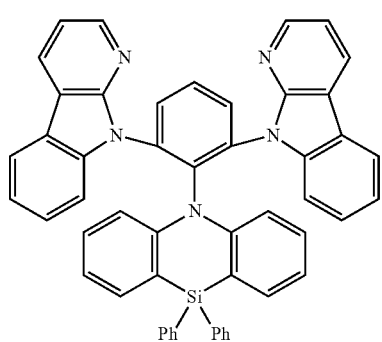
12
-continued
30
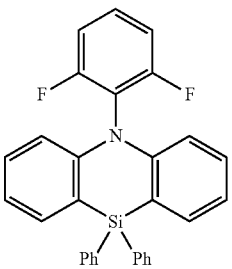
31
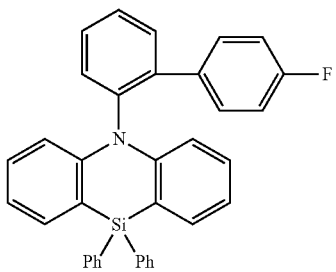
32
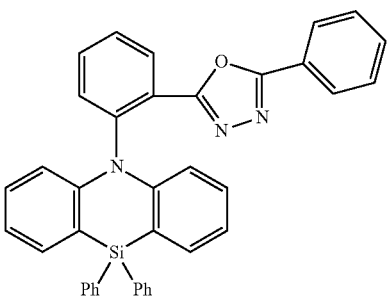
33
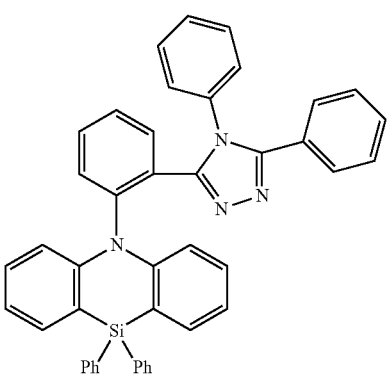
34
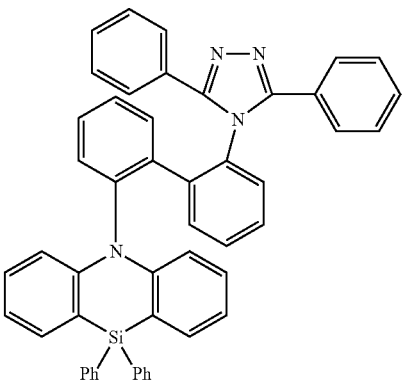

35
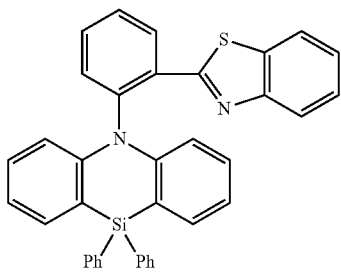
36
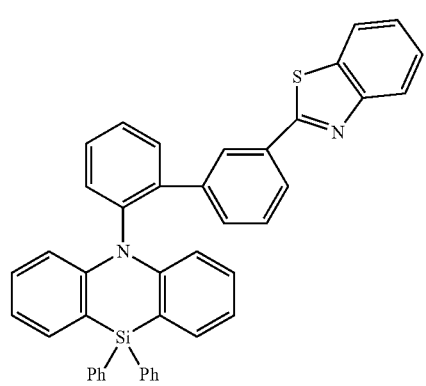
37
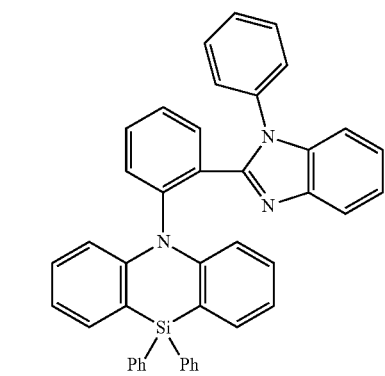
38
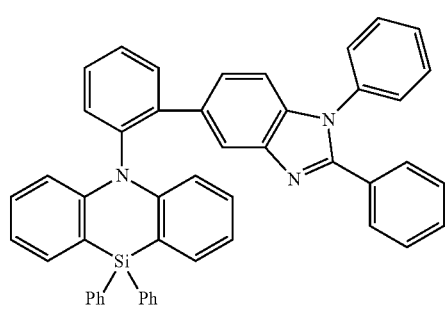
39
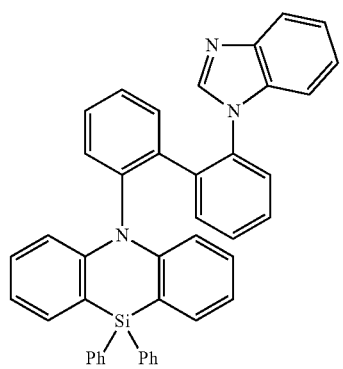
40
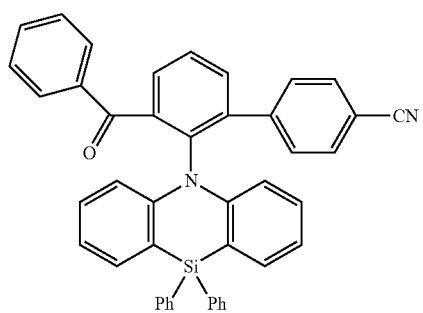
41
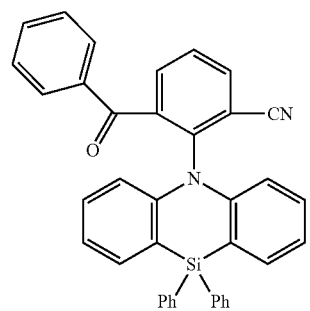
42
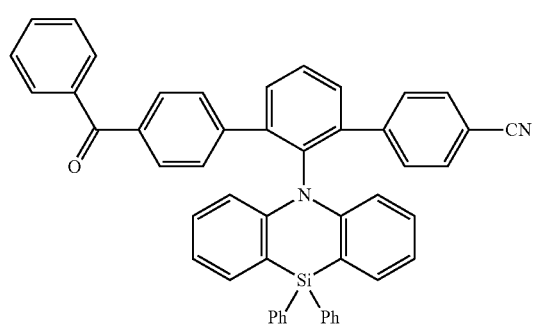
43
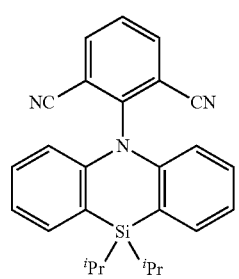

44
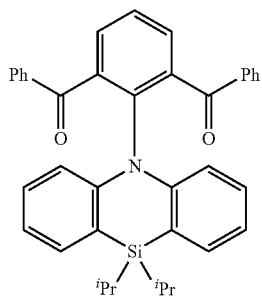
45
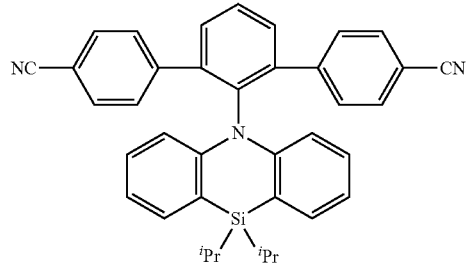
46
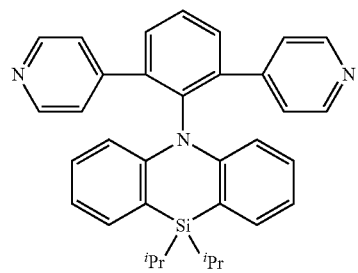
47
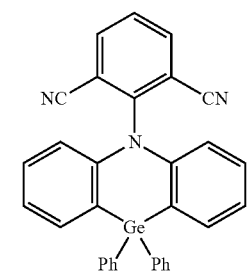
48
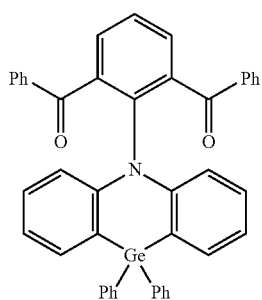
49
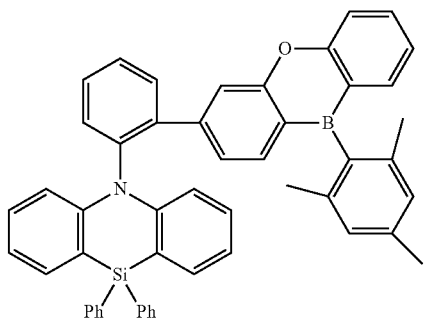
50
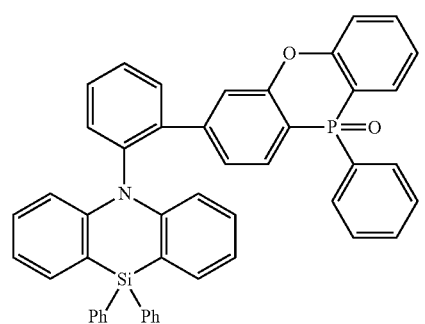
51
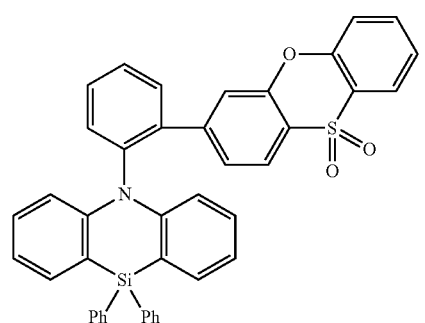
52
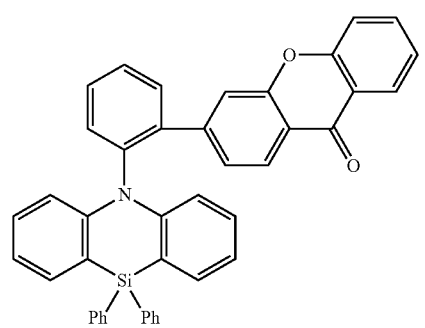
53
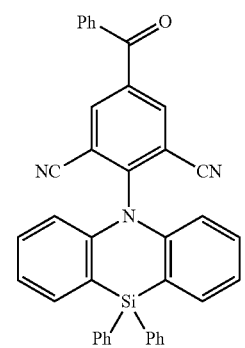

-continued

54
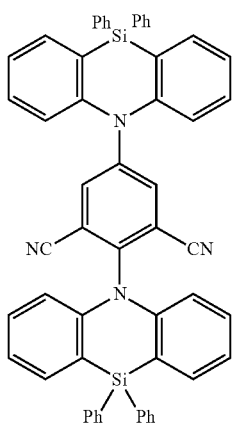

55
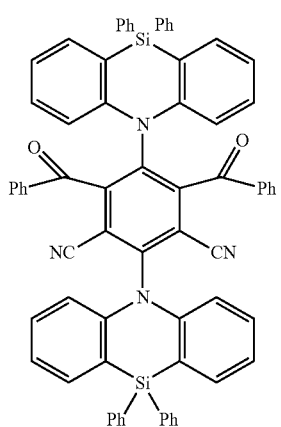

56
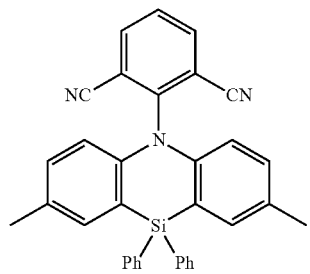

57
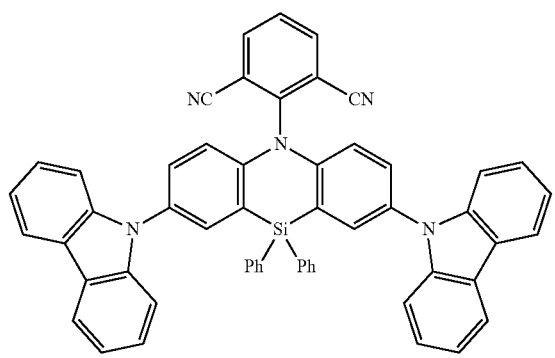

-continued

58
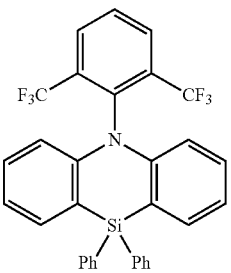

59
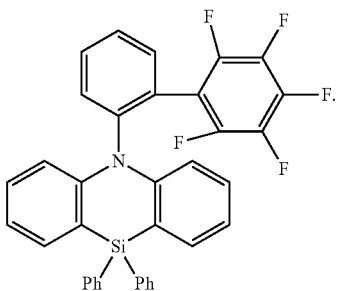

Embodiments are also directed to an organic electroluminescence device, including a first electrode; a hole transport region on the first electrode; an emission layer on the hole transport region; an electron transport region on the emission layer; and a second electrode on the electron transport region. The emission layer includes a nitrogen-containing compound represented by the following Formula 1:

[Formula 1]

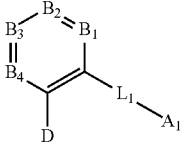

wherein in Formula 1, $B_1$ to $B_4$ are each independently N or $CR_1$, $R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group having 2 to 30 ring carbon atoms, $L_1$ is a direct linkage, a substituted or unsubstituted arylene group having 6 to 50 ring carbon atoms, or a substituted or unsubstituted heteroarylene group having 2 to 50 ring carbon atoms, $A_1$ is an electron accepting group, D is an electron donating group represented by the following Formula 2:

[Formula 2]

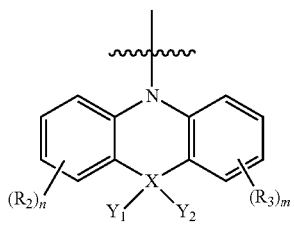

wherein in Formula 2, X is Si or Ge, $Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms, $R_2$ and $R_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and n and m are each independently an integer of 0 to 4.

$A_1$ may be a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or represented by the following Formula 3:

[Formula 3]

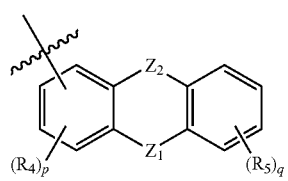

wherein in Formula 3, $Z_1$ is —SO—, —SO$_2$—, —BR$_6$—,

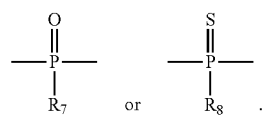

$Z_2$ is O, S, or NAr, Ar is a substituted or unsubstituted aryl group having 6 to 30 ring carbon atoms, or a substituted or unsubstituted heteroaryl group having 2 to 30 ring carbon atoms, $R_6$ to $R_8$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, $R_4$ and $R_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

The nitrogen-containing compound represented by Formula 1 may be a nitrogen-containing compound represented by the following Formula 1-1:

[Formula 1-1]

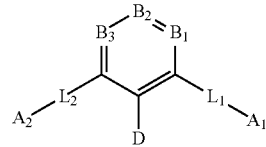

wherein in Formula 1-1, $L_2$ is a direct linkage, a substituted or unsubstituted arylene group having 6 to 50 ring carbon atoms, or a substituted or unsubstituted heteroarylene group having 2 to 50 ring carbon atoms. A) is an electron accepting group, and $B_1$ to $B_3$ and D are the same as defined above.

$Y_1$ and $Y_2$ may each independently be a substituted or unsubstituted phenyl group, or a substituted or unsubstituted isopropyl group.

$A_1$ may be a cyano group, or a fluorine atom, or a group represented by any one of the following formulae:

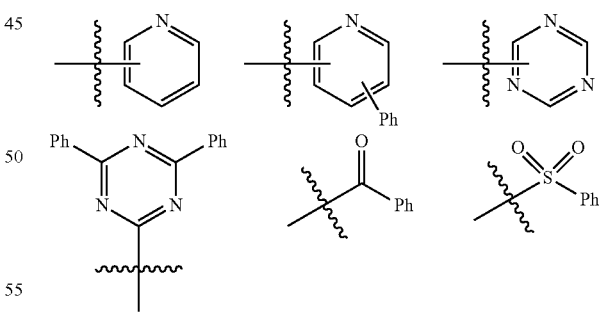

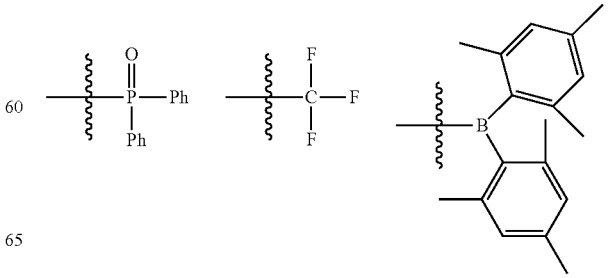

-continued

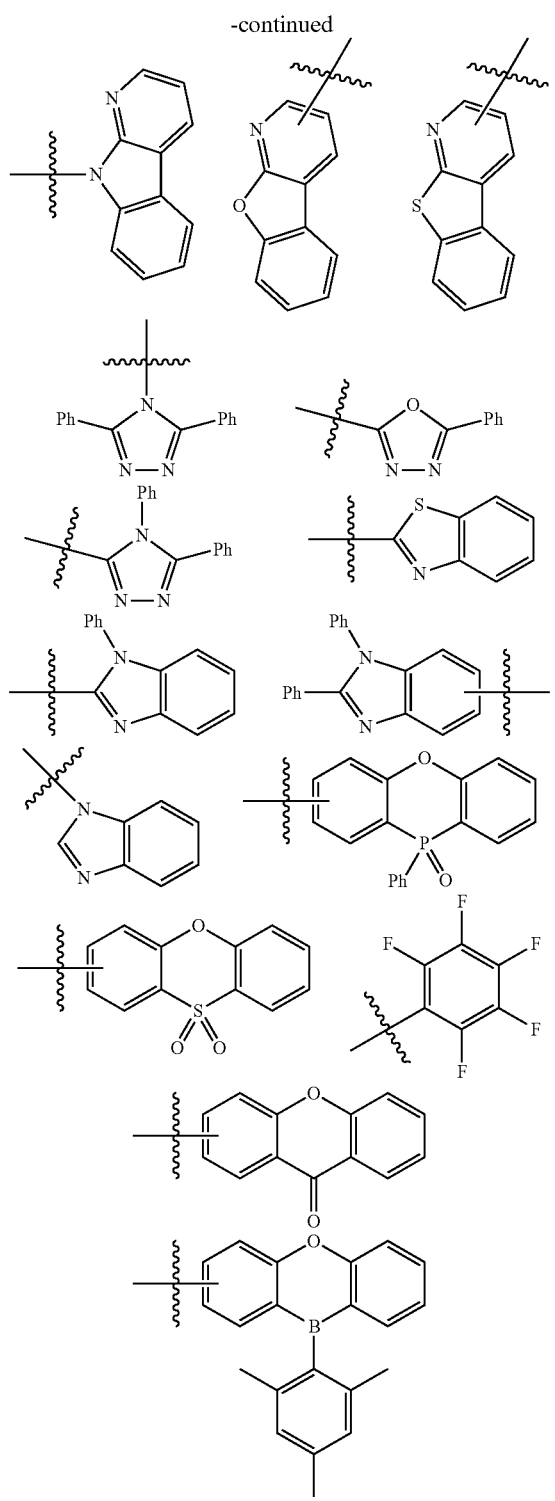

where Ph indicates a phenyl group.

The emission layer may emit thermally activated delayed fluorescence.

$A_1$ may be a substituted or unsubstituted triazine group, or a substituted or unsubstituted carbonyl group.

The nitrogen-containing compound represented by Formula 1 may be at least one compound selected from compounds represented in the following Compound Group 1:

[Compound Group 1]

1
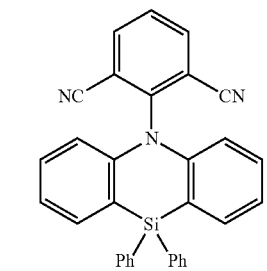

2
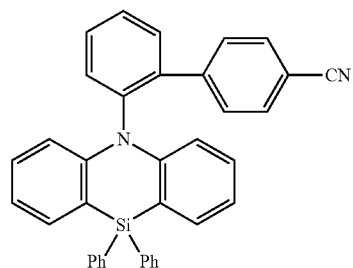

3
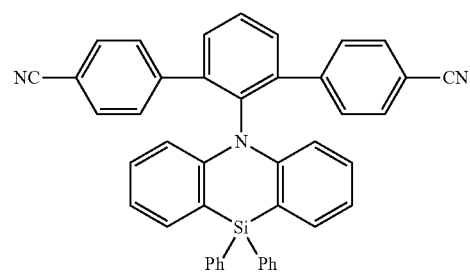

4
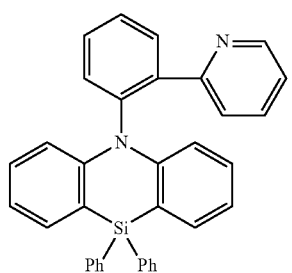

5
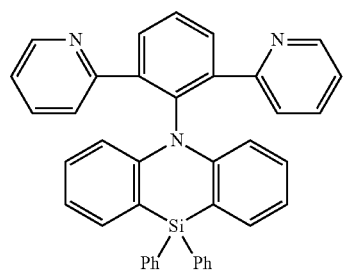

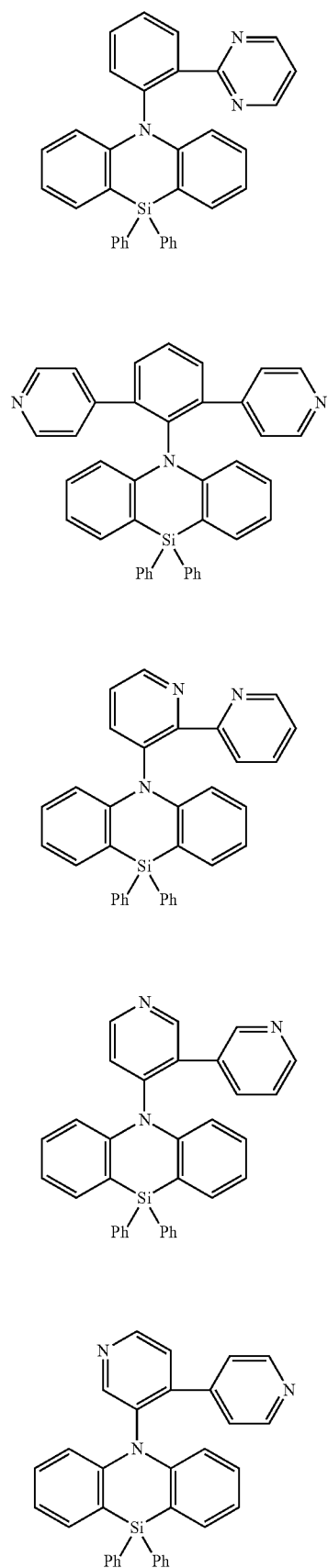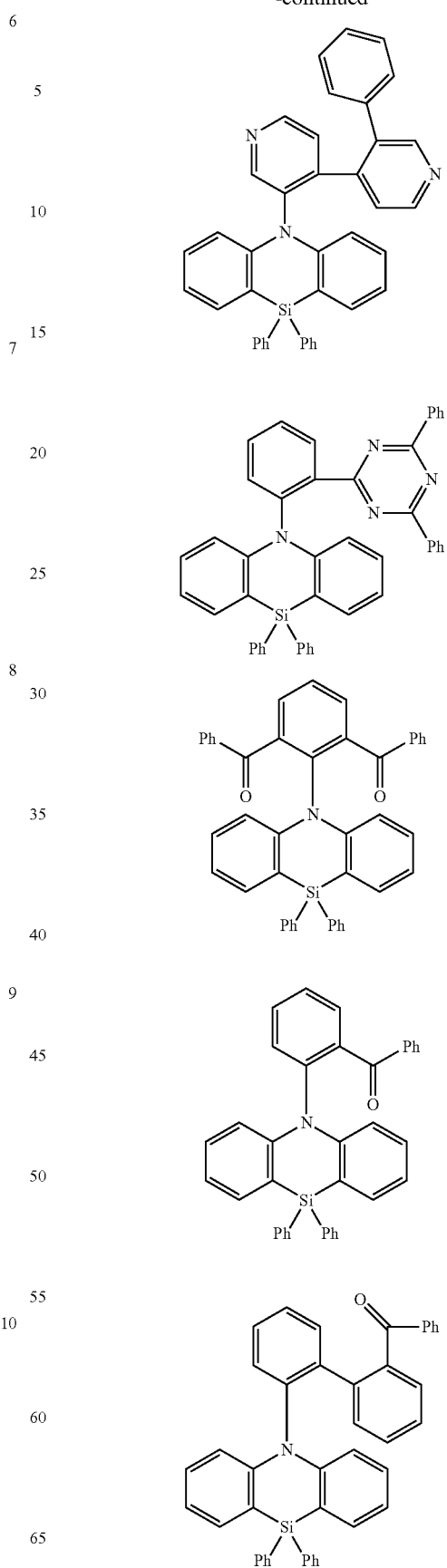

16
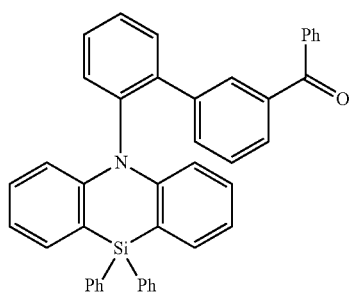
17
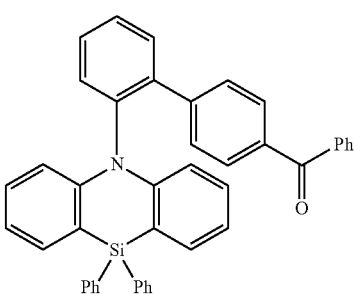
18
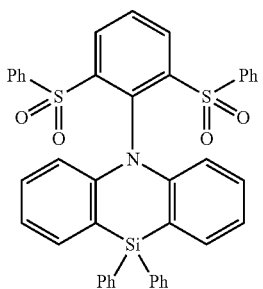
19
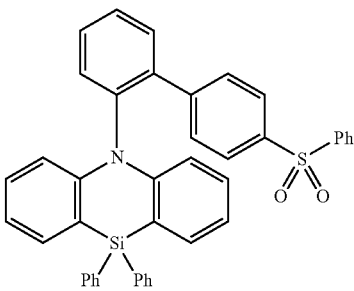
20
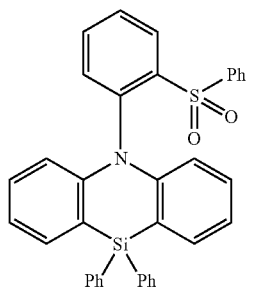
21
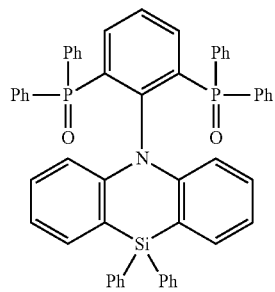
22
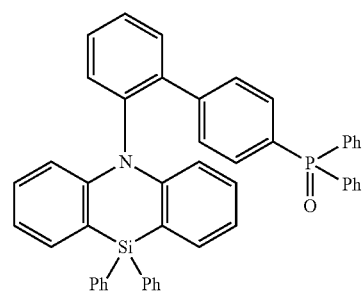
23
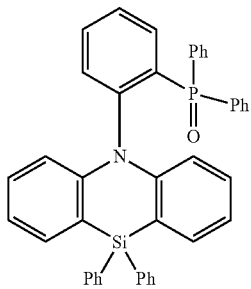
24
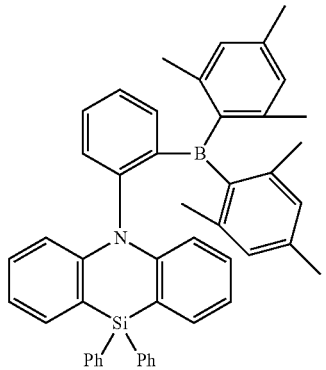
25
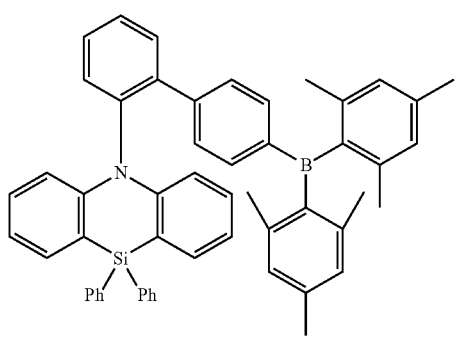

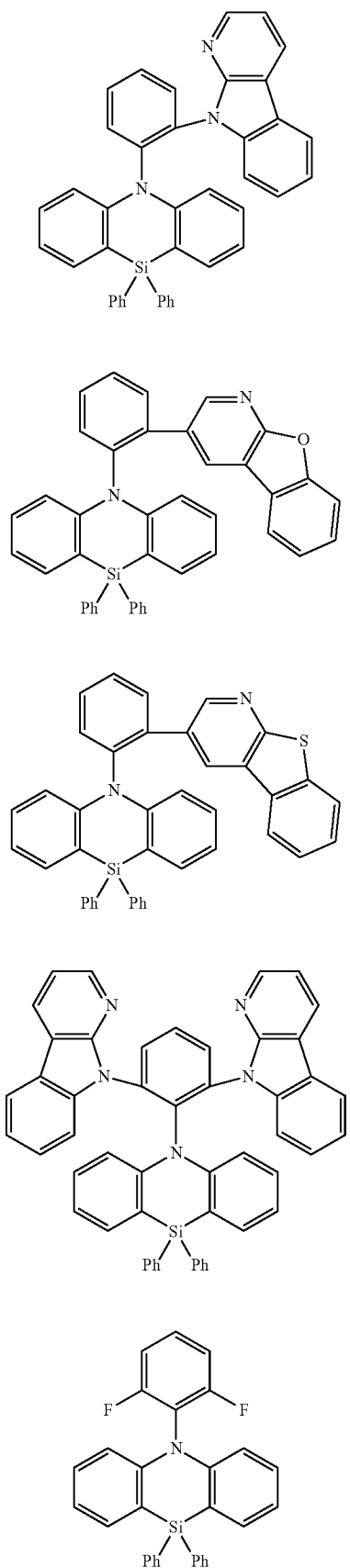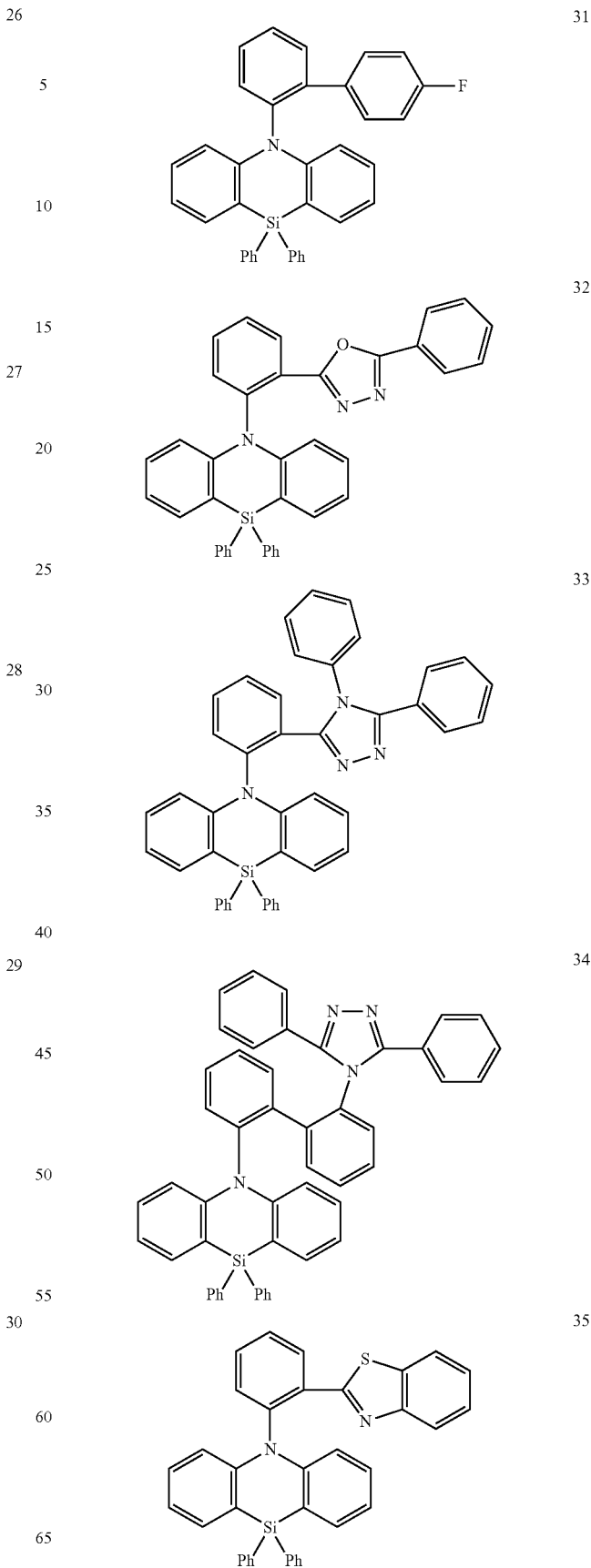

36
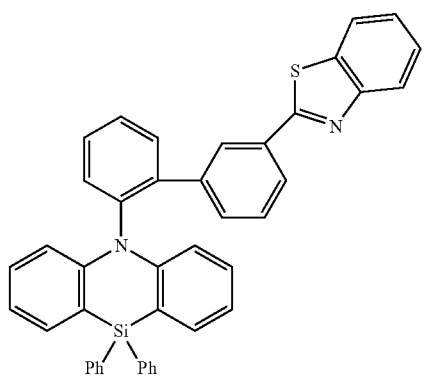
37
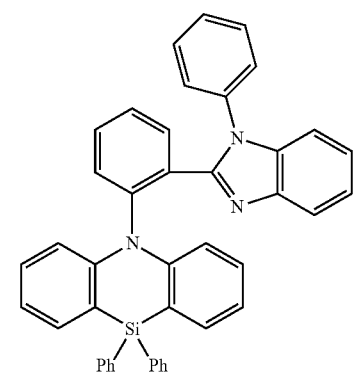
38
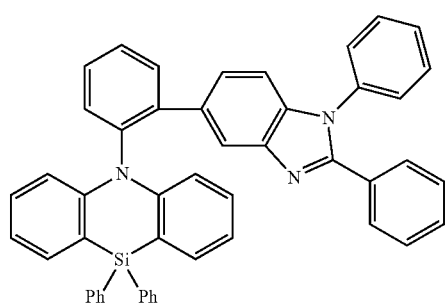
39
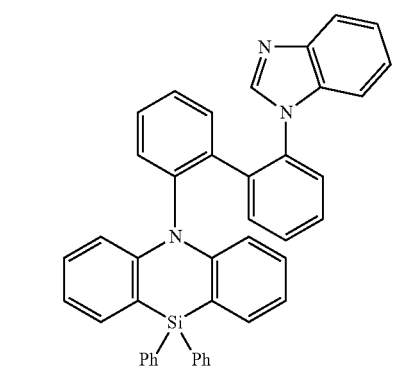
40
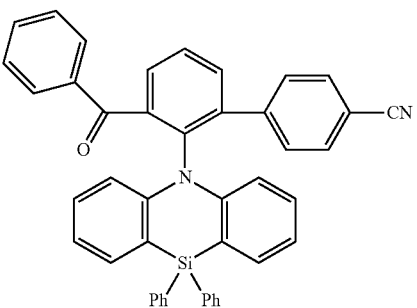
41
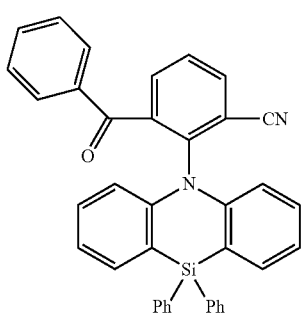
42
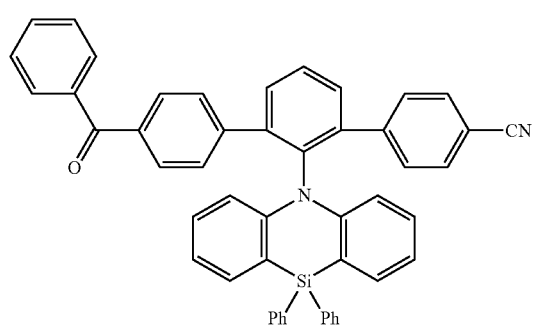
43
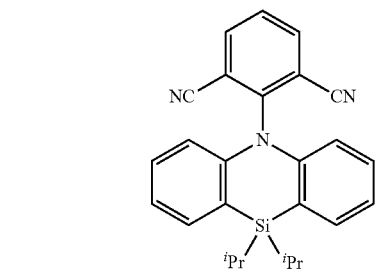
44
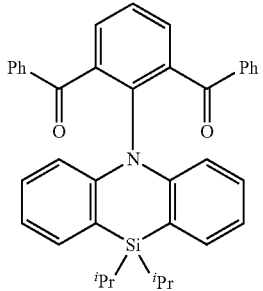

31
-continued
45
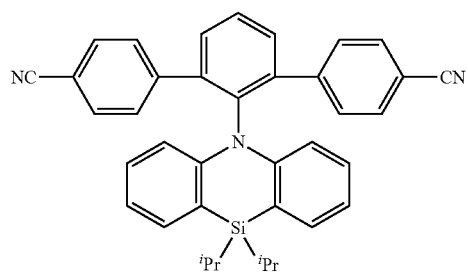
46
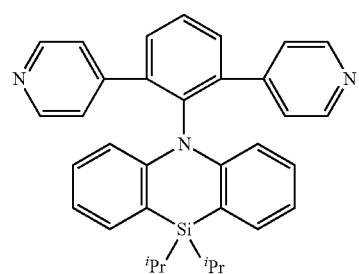
47
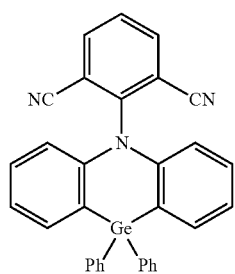
48
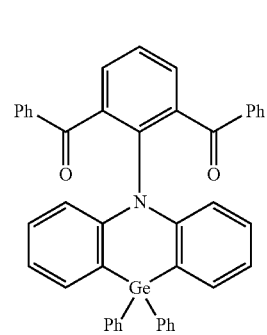
49
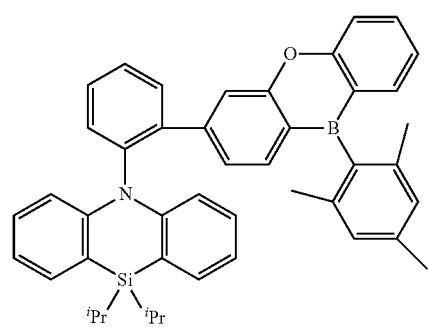
32
-continued
50
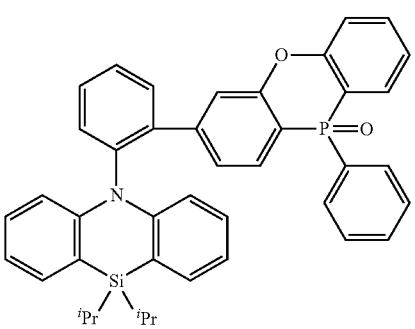
51
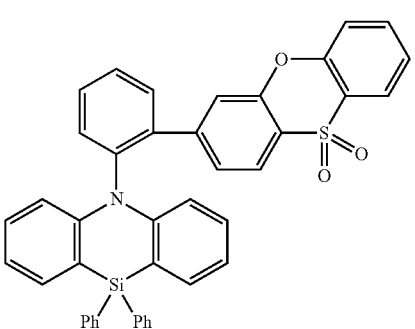
52
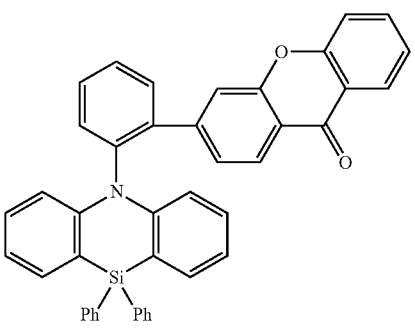
53
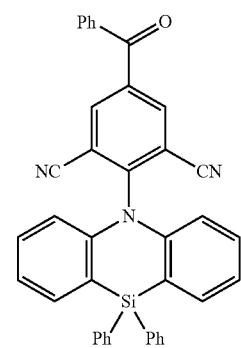

54

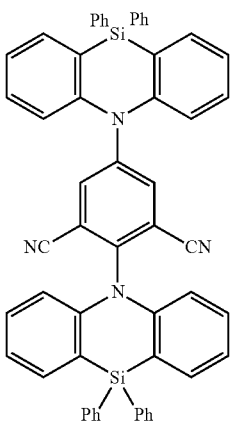

55

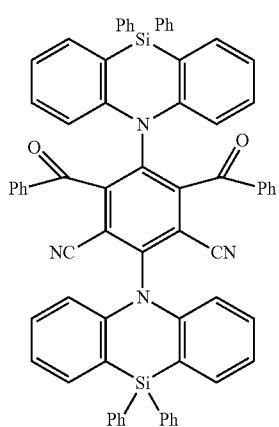

56

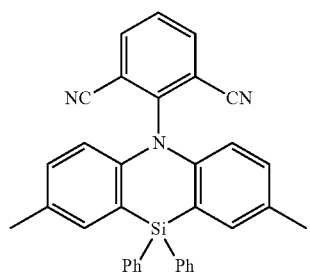

57

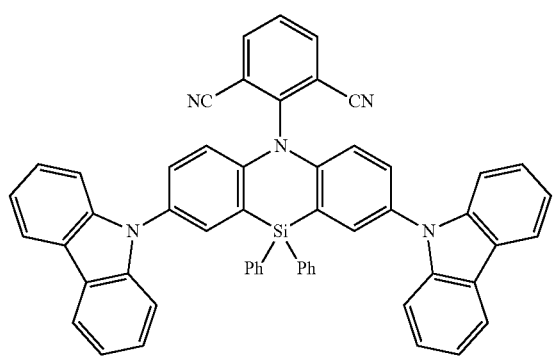

58

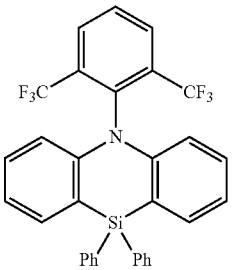

59

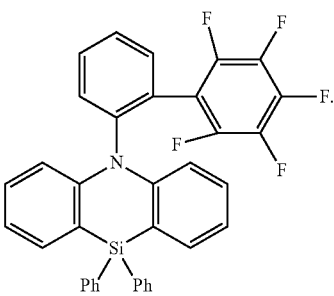

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
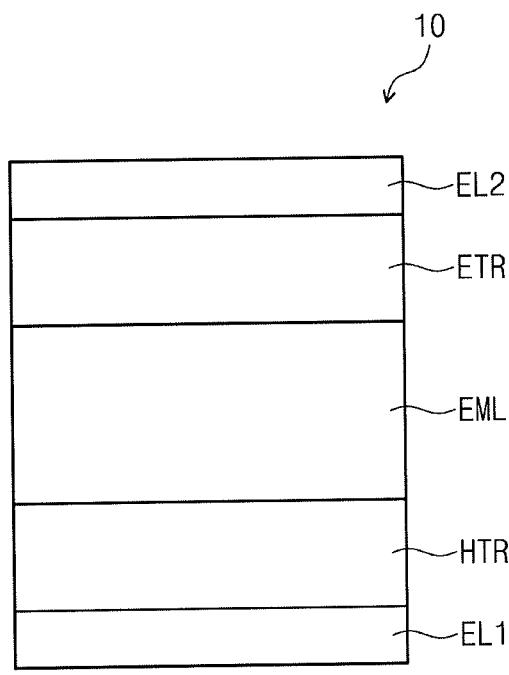
FIG. 1 illustrates a schematic cross-sectional view of an organic electroluminescence device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being on another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. It will be further understood that the terms "comprise" or "have," when used in this specification, specify the presence of stated features, numerals, steps, operations, elements, parts, or a combination thereof, but do not preclude the presence or addition of one or more other features, numerals, steps, operations, elements, parts, or a combination thereof.

In the present disclosure,

in a reproduced portion of a formula represents a connection to a remaining portion of the formula.

In the present disclosure, "substituted or unsubstituted" may indicate that a group is unsubstituted or is substituted with at least one substituent selected from deuterium, halogen, cyano, nitro, amino, silyl, boron (boryl), phosphine, alkyl, aralkyl, alkenyl, aryl and heterocyclic. In addition, each of the substituents illustrated above may be substituted or unsubstituted. For example, biphenyl may be interpreted as aryl, or phenyl substituted with phenyl.

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 30, 1 to 20, 1 to 10 or 1 to 4. When a bulky substituent is desired, the carbon number of the alkyl group may be, for example, 3 to 20. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the term "aryl group" refers to any functional group or substituent derived from an aromatic hydrocarbon ring. The aryl group may be a monocyclic aryl group or a polycyclic aryl group. The ring carbon number of the aryl group may be 6 to 50, 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, byphenylene, triphenylene, pyrenyl, benzofluoranthenyl, chrysenyl, etc., groups.

In the present disclosure, the fluorenyl group may be substituted. For example, two substituents may be combined with each other to form a spiro structure. Examples of the substituted fluorenyl group may include the following groups.

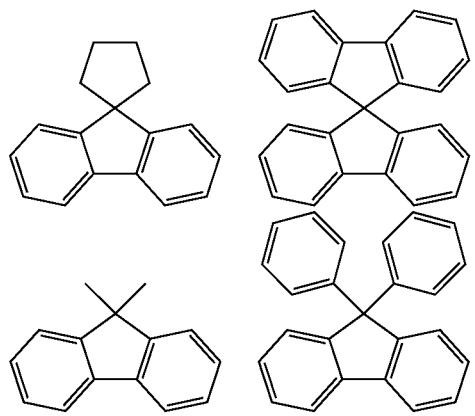

In the present disclosure, the above examples of alkyl group may be applied to each alkyl group of the alkoxy, aralkyl and alkylthio groups.

In the present disclosure, the above examples of aryl group may be applied to each aryl group of the aryloxy, aralkyl and arylthio groups.

In the present disclosure, the heterocyclic group may include an aliphatic heterocycle and an aromatic heterocycle. The term "aromatic heterocycle" may refer to a heteroaryl group. The heterocyclic group may be monocyclic group or polycyclic group. The carbon number of the heterocycle group may be, for example, 2 to 30, or 2 to 20.

In the present disclosure, the heteroaryl group may include at least one of O, N, P, Si or S as a heteroatom. When the heteroaryl group includes two heteroatoms, the two heteroatoms may be the same or different from each other. The ring carbon number of the heteroaryl group may be 2 to 50, 2 to 30, or 2 to 20. The heteroaryl group may be a monocyclic heteroaryl group or a polycyclic heteroaryl group. The polycyclic heteroaryl group may have, for example, a bicyclic or tricyclic structure. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc., groups.

In the present disclosure, the definition of an aryl group may be applied to an arylene group, except that the arylene group is divalent.

The definition of a heteroaryl group may be applied to a heteroarylene group, except that the heteroarylene group is divalent.

In the present disclosure, the term "silyl group" includes alkyl silyl and aryl silyl groups. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc., groups.

In the present disclosure, the term "boron (boryl) group" includes alkyl boron groups and aryl boron groups. Examples of the boron group may include trimethyl boron, triethyl boron, t-butyl dimethyl boron, triphenyl boron, diphenyl boron, phenyl boron, etc., groups.

In the present disclosure, the alkenyl group may be linear or branched. The carbon number may be, for example, 2 to 30, 2 to 20, or 2 to 10. Examples of the alkenyl group may include, for example, vinyl, 1-butenyl, 1-pentenyl. 1,3-butadienyl aryl, styrenyl, styrylvinyl, etc.

In the present disclosure, the carbon number of the amino group may be, for example, 1 to 30. The amino group may include alkyl amino groups and aryl amino groups. Examples of the amino group may include methylamino, dimethylamino, phenylamino, diphenylamino, naphthylamino, 9-methyl-anthracenylamino, triphenylamino, etc., groups.

In the present disclosure, the phosphine oxide group may be substituted with, for example, at least one of alkyl or aryl.

In the present disclosure, the phosphine sulfide group may be substituted with, for example, at least one of an alkyl group or an aryl group.

In the present disclosure, the substituted or unsubstituted carbonyl group may be substituted with, for example, at least one of an alkyl group or an aryl group.

Hereinafter, the nitrogen-containing compound according to an embodiment of the present disclosure will be explained.

The nitrogen-containing compound according to an embodiment of the present disclosure is represented by the following Formula 1:

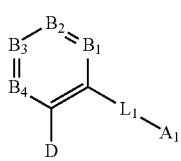

[Formula 1]

In Formula 1, $B_1$ to $B_4$ are each independently N or $CR_1$, $R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group having 2 to 30 ring carbon atoms.

In Formula 1, $L_1$ may be a direct linkage, a substituted or unsubstituted arylene group having 6 to 50 ring carbon atoms, or a substituted or unsubstituted heteroarylene group having 2 to 50 ring carbon atoms. In Formula 1, when $L_1$ is a direct linkage, $A_1$ is directly linked to the ring including $B_1$ to $B_4$.

In Formula 1, $A_1$ may be an electron accepting group, and D may be an electron donating group. The nitrogen-containing compound according to an embodiment of the present disclosure may have a structure of a ring including $B_1$ to $B_4$ substituted with an electron accepting group and an electron donating group in an ortho position.

In Formula 1, D may be an electron donating group represented by the following Formula 2.

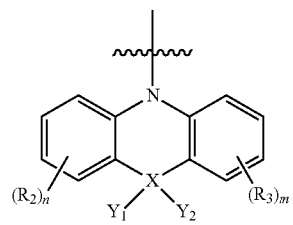

[Formula 2]

In Formula 2, X is Si or Ge, $Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms.

In Formula 2, $Y_1$ and $Y_2$ may be relatively bulky substituents, for example, an alkyl group having 3 or more carbon atoms, or an aryl or heteroaryl group having a ring form.

In Formula 2, $R_2$ and $R_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and n and m are each independently an integer of 0 to 4.

When n is 1, $R_2$ may be substituted with a substituent other than a hydrogen atom. When m is 1, $R_3$ may be substituted with a substituent other than a hydrogen atom.

When n is an integer of 2 or more, a plurality of $R_2$ may be the same or different from each other. When m is an integer of 2 or more, a plurality of $R_3$ may be the same or different from each other.

Each of n and m may be 0. In some implementations, each of n and m may be 1, and $R_2$ and $R_3$ may be each independently a substituted or unsubstituted alkyl group having 1 to 10 carbon atoms. For example, each of n and m may be 1, and each of $R_2$ and $R_3$ may be a substituted or unsubstituted methyl group.

The electron accepting group $A_1$ may be, for example, a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or a group represented by the following Formula 3.

[Formula 3]

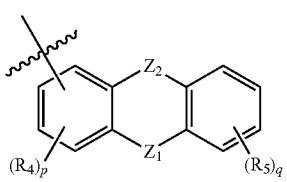

In Formula 3, $Z_1$ is —SO—, —SO$_2$—, —BR$_6$—,

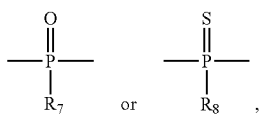 , $Z_2$ is O, S, or NAr, Ar is a substituted or unsubstituted aryl group having 6 to 30 ring carbon atoms, or a substituted or unsubstituted heteroaryl group having 2 to 30 ring carbon atoms, $R_6$ to $R_8$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, $R_4$ and $R_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

When p is 1, $R_4$ may be substituted with a substituent other than a hydrogen atom. When q is 1, $R_5$ may be substituted with a substituent other than a hydrogen atom.

When p is an integer of 2 or more, a plurality of $R_4$ may be the same or different from each other. When q is an integer of 2 or more, a plurality of $R_5$ may be the same or different from each other.

When $A_1$ is a substituted or unsubstituted heteroaryl group including nitrogen, $A_1$ may have a monocyclic, bicyclic or tricyclic ring structure, for example.

$A_1$ may be, for example, a cyano group, or a fluorine atom, or may be a group represented by any one of the following formulae.

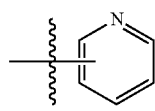 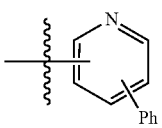 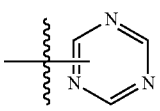

-continued

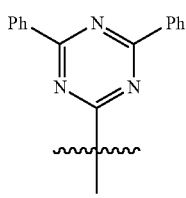 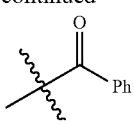 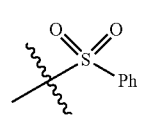

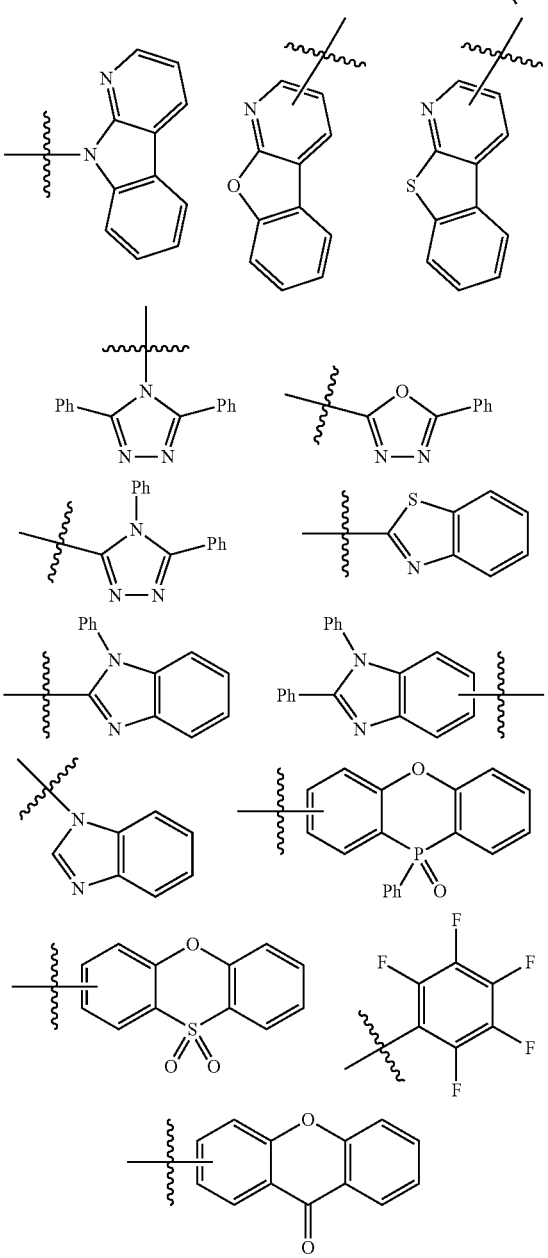

-continued

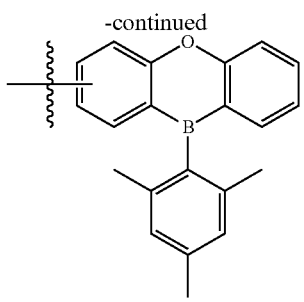

In the above formulae, Ph indicates a substituted or unsubstituted phenyl group. The above formulae may be substituted with a substituent other than a hydrogen atom.

When $A_1$ is a cyano group, $L_1$ may be a substituted or unsubstituted arylene group. In this case, the degree of molecular distortion increases, and the difference between the singlet energy level and the triplet energy level may be close to zero, which makes the compound suitable to be applied to thermally activated delayed fluorescence materials.

$A_1$ may be is a substituted or unsubstituted triazine group, or a substituted or unsubstituted carbonyl group. For example, $A_1$ may be represented by any one of the following formulae. In this case, the compound may provide an organic electroluminescence device with high efficiency and long life when used as a material therefor.

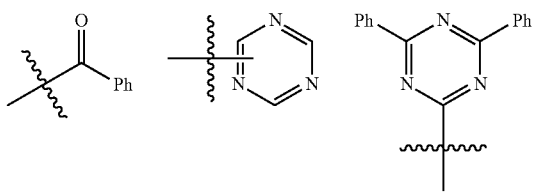

In the above formulae, the symbol 'Ph' refers to a substituted or unsubstituted phenyl group. For example, Ph may represent an unsubstituted phenyl group.

$Y_1$ and $Y_2$ may be each independently a substituted or unsubstituted phenyl group, or a substituted or unsubstituted propyl group. $Y_1$ and $Y_2$ may be each independently a substituted or unsubstituted phenyl group, or a substituted or unsubstituted isopropyl group. In some implementations, $Y_1$ and $Y_2$ may be the same as each other. For example, each of $Y_1$ and $Y_2$ may be a substituted or unsubstituted phenyl group. In another example, each of $Y_1$ and $Y_2$ may be a substituted or unsubstituted isopropyl group.

The nitrogen-containing compound of Formula 1 may be a nitrogen-containing compound represented by the following Formula 1-1, as an example.

[Formula 1-1]

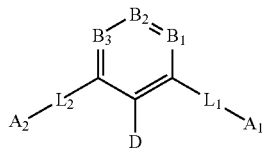

In Formula 1-1, $L_2$ is a direct linkage, a substituted or unsubstituted arylene group having 6 to 50 ring carbon atoms, or a substituted or unsubstituted heteroarylene group having 2 to 50 ring carbon atoms. $L_1$ and $L_2$ may be the same or different from each other. When $L_2$ is a direct linkage, $A_2$ is directly linked to the ring including $B_1$ to $B_3$.

$L_2$ may be a direct linkage, or a substituted or unsubstituted phenylene group, as examples.

In Formula 1-1, $A_2$ may be an electron accepting group. In this case, the nitrogen-containing compound according to an embodiment of the present disclosure may have a structure including two electron accepting groups. $A_1$ and $A_2$ may be the same or different from each other.

In Formula 1-1, $B_1$ to $B_3$ and D are the same as defined above.

$A_2$ may be, for example, a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or a group represented by the following Formula 3.

[Formula 3]

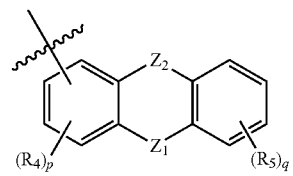

In Formula 3, $Z_1$ is —SO—, —$SO_2$—, —$BR_6$—,

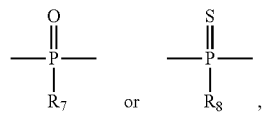

$Z_2$ is O, S, or NAr, Ar is a substituted or unsubstituted aryl group having 6 to 30 ring carbon atoms, or a substituted or unsubstituted heteroaryl group having 2 to 30 ring carbon atoms, $R_6$ to $R_8$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, $R_4$ and $R_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

In case p is 1, $R_4$ may be substituted with a substituent other than a hydrogen atom. When q is 1, $R_5$ may be substituted with a substituent other than a hydrogen atom. When p is an integer of 2 or more, a plurality of $R_4$ may be the same or different from each other. When q is an integer of 2 or more, a plurality of $R_5$ is the same or different from each other.

When $A_2$ is a substituted or unsubstituted heteroaryl group including nitrogen, $A_2$ may have, for example, a monocyclic, bicyclic or tricyclic ring structure.

$A_2$ may be, for example, a cyano group, a fluorine atom, or a group represented by any one of the following formulae.

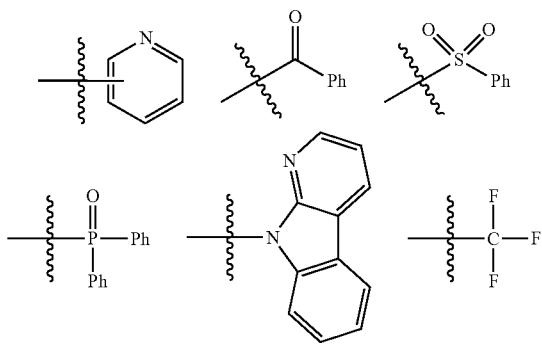

In the above formulae, 'Ph' refers to a substituted or unsubstituted phenyl group. For example, Ph may be an unsubstituted phenyl group.

In Formula 1, L1 may be, for example, a direct linkage, a substituted or unsubstituted phenylene group, or a substituted or unsubstituted divalent biphenylene group.

In Formula 1, the number of N in $B_1$ to $B_4$ may be 0 or 1. For example, $B_1$ to $B_4$ may be each independently represented by $CR_1$, or any one of $B_1$ to $B_4$ may be N and the others of $B_1$ to $B_4$ may be each independently represented by $CR_1$. For example, the ring including $B_1$ to $B_4$ may be a phenyl group or a pyrimidine group. When $B_1$ to $B_4$ are each independently represented by $CR_1$, the number of electron donating groups or electron accepting groups may be controlled by controlling the type of $R_1$. For example, the nitrogen-containing compound according to an embodiment of the present disclosure may include two electron donating groups. For example, the nitrogen-containing compound according to an embodiment of the present disclosure may include two electron accepting groups.

In Formula 1, $B_2$ may be $CR_1$. $R_1$ may be substituted with a substituent other than a hydrogen atom. For example, $B_2$ may be $CR_1$, and $R_1$ may be a substituted or unsubstituted carbonyl group, or a substituted or unsubstituted heterocycle group having 2 to 30 ring carbon atoms. For example, $B_2$ may be $CR_1$, and $R_1$ may be represented by any one of the following formulae.

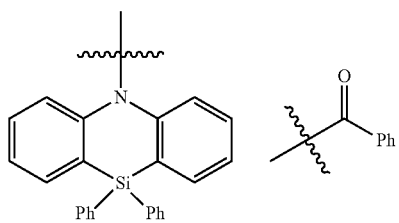 [SMILES: *N1c2ccccc2[Si](c2ccccc2)(c2ccccc2)c2ccccc21 ; *C(=O)c1ccccc1]

In the above formulae, the symbol 'Ph' refers to a substituted or unsubstituted phenyl group. For example, Ph may be an unsubstituted phenyl group.

The nitrogen-containing compound according to an embodiment of the present disclosure may have an absolute value of the difference between the lowest excitation singlet energy level (S1) and the lowest excitation triplet energy level (T1) of about 0.2 eV or less.

The nitrogen-containing compound represented by Formula 1 according to an embodiment of the present disclosure may be, for example, any compound selected from compounds represented in the following Compound Group 1.

[Compound Group 1]

1

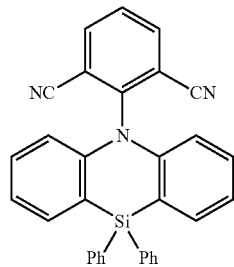

2

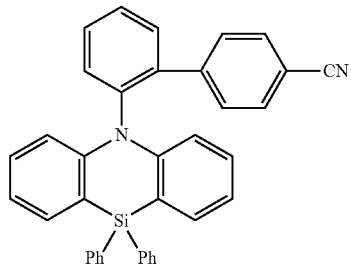

3

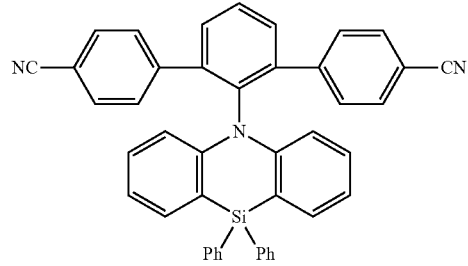

4

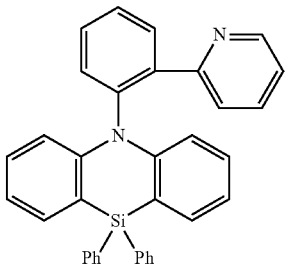

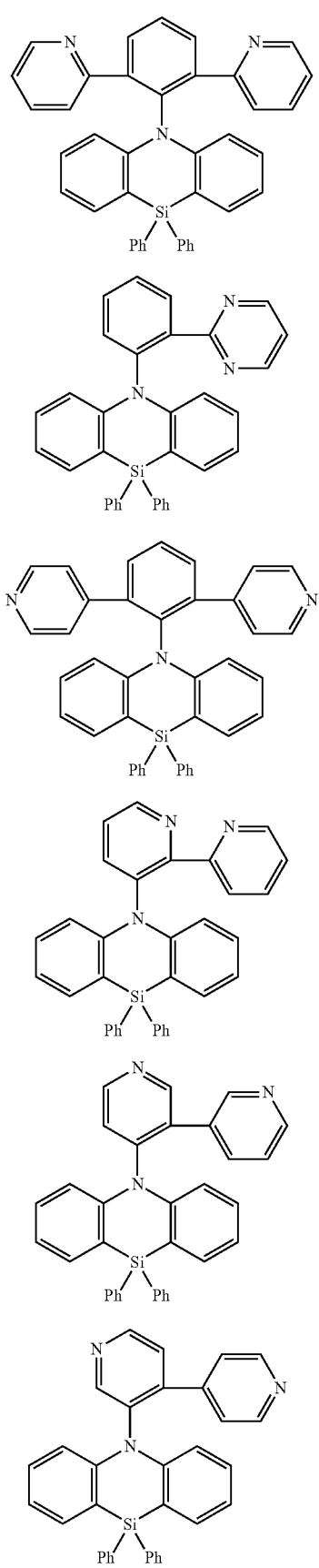
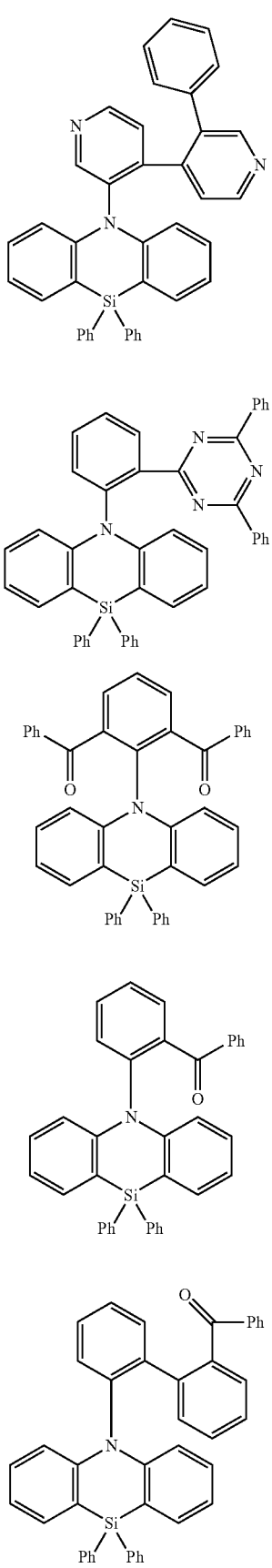

16
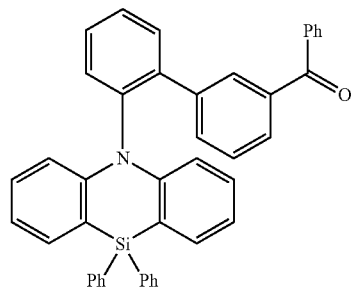
17
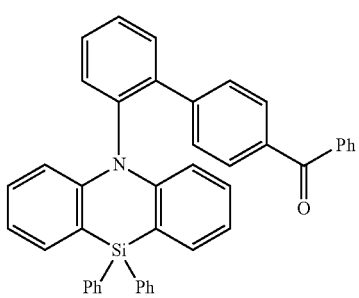
18
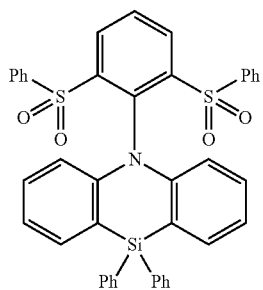
19
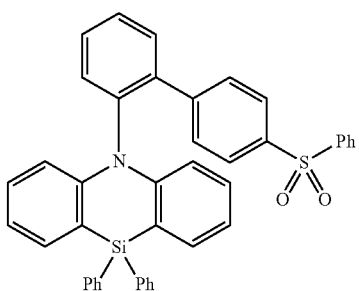
20
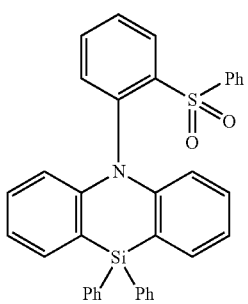
21
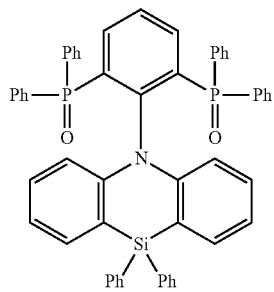
22
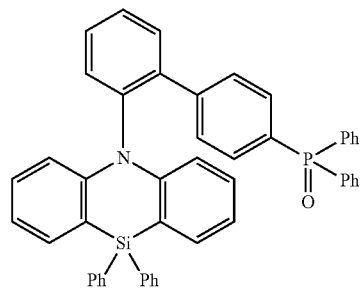
23
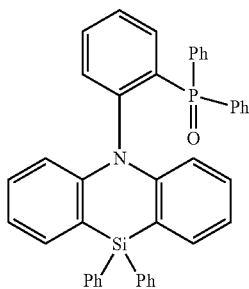
24
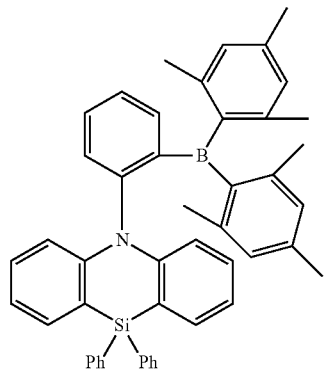
25
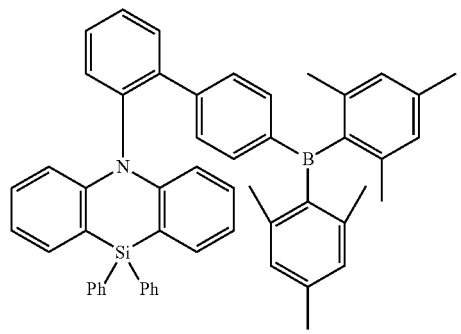

-continued
26
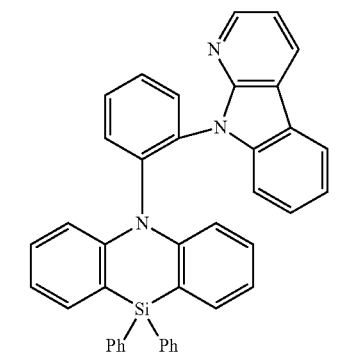
27
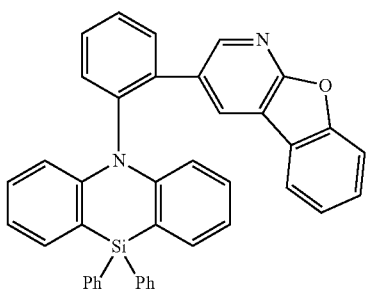
28
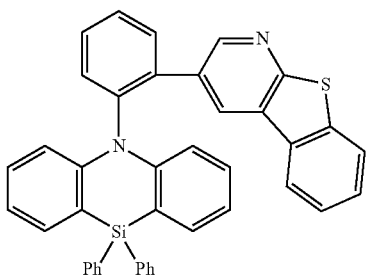
29
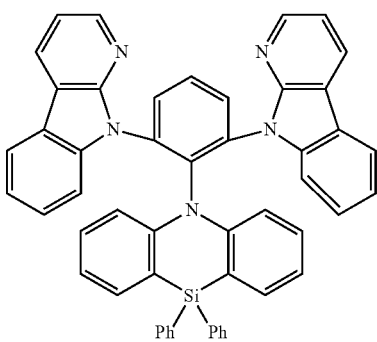
30
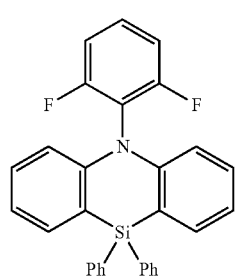
-continued
31
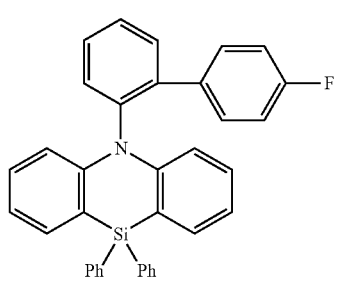
32
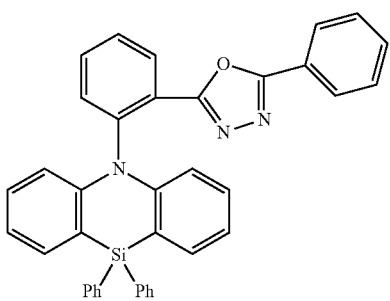
33
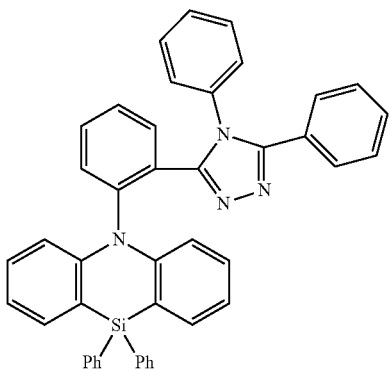
34
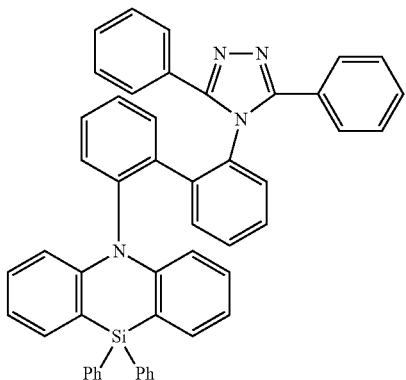
35
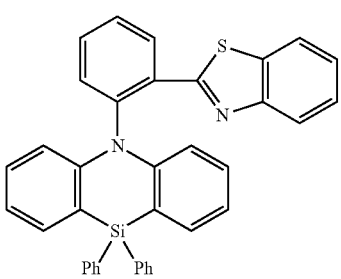

-continued
36
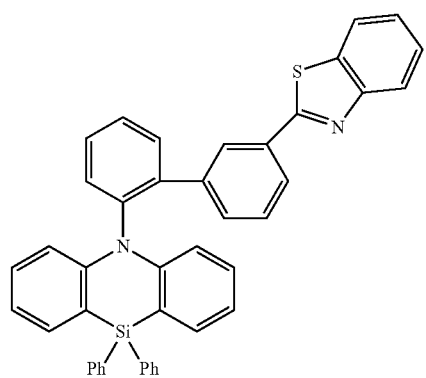
37
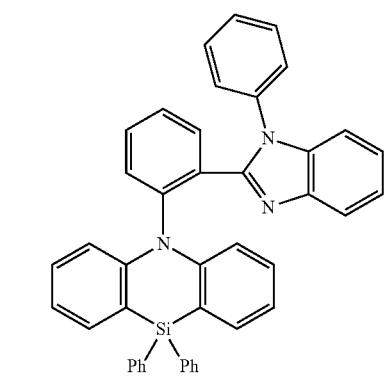
38
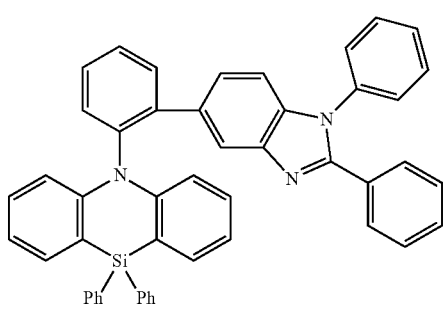
39
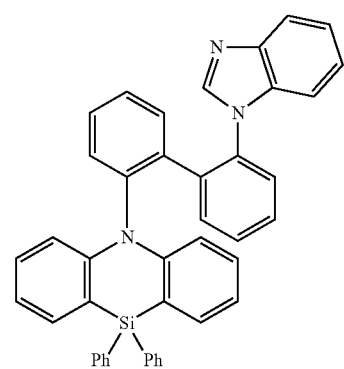
-continued
40
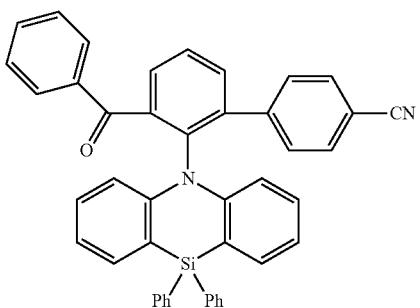
41
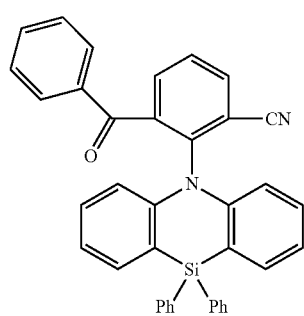
42
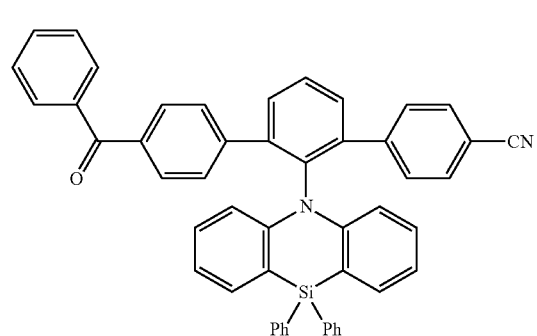
43
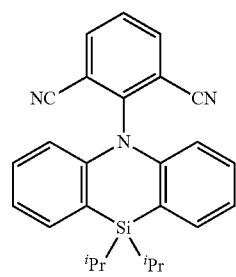
44
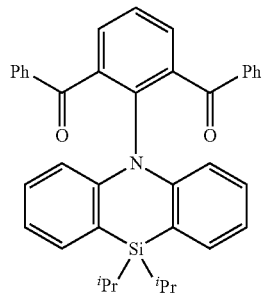

45
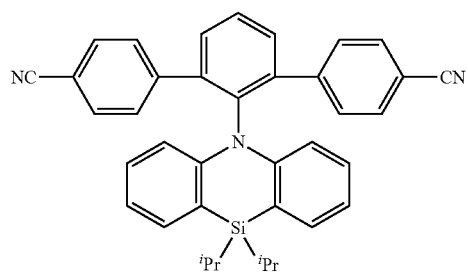
46
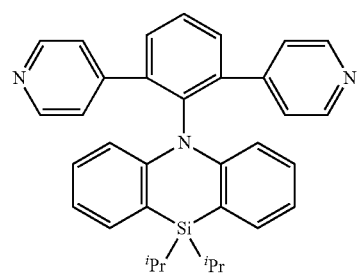
47
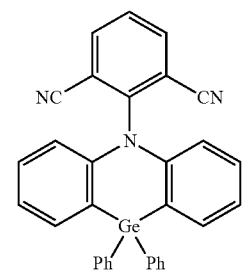
48
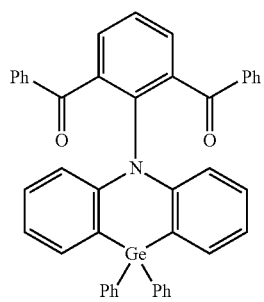
49
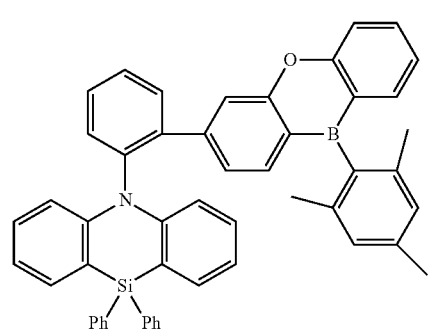
50
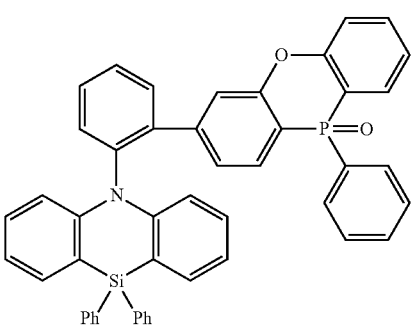
51
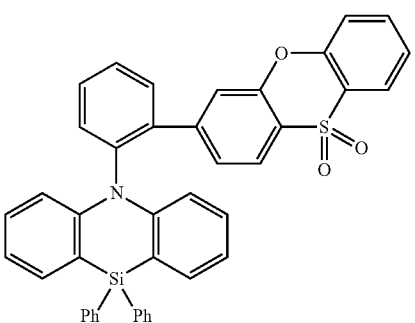
52
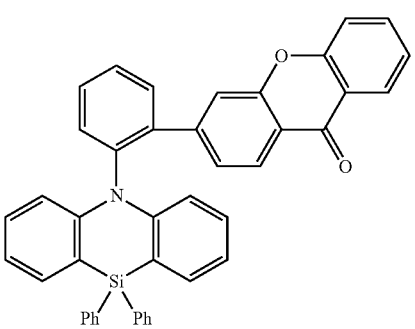
53
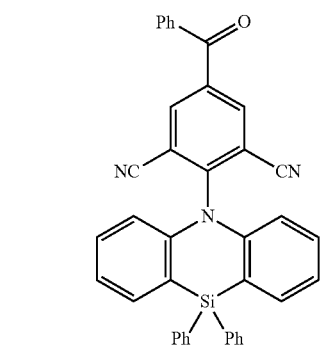

54

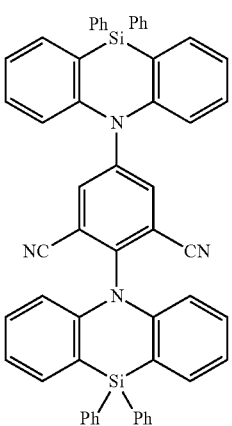

55

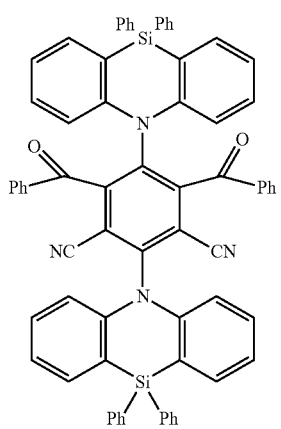

56

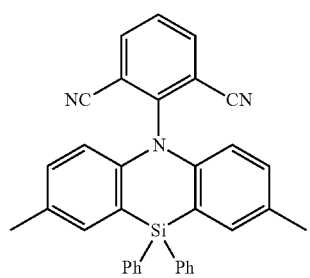

57

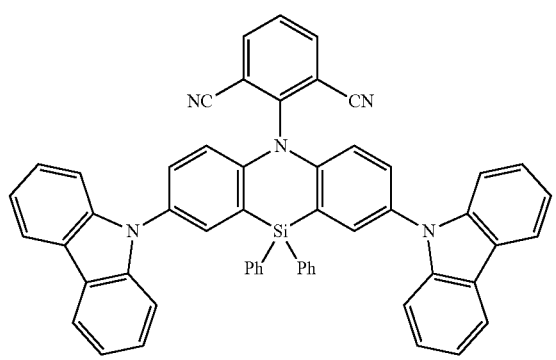

58

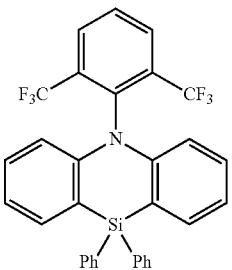

59

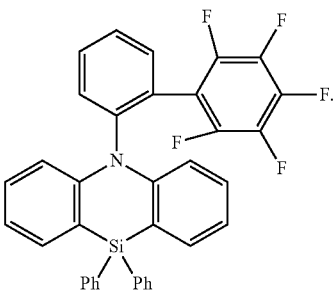

In the above formulae, the symbol 'Ph' refers to a substituted or unsubstituted phenyl group, and the symbol 'iPr' refers to a substituted or unsubstituted isopropyl group.

The nitrogen-containing compound according to an embodiment of the present disclosure includes an electron donating group and an electron accepting group. In the nitrogen-containing compound according to an embodiment of the present disclosure, an electron donating group and an electron accepting group are substituted to the linker in an ortho position, so that the degree of molecular distortion increases due to a steric hindrance and the difference between the lowest excitation singlet energy level and the lowest excitation triplet energy level decreases. As a result, the nitrogen-containing compound according to an embodiment of the present disclosure may be utilized as thermally activated delayed fluorescence (TADF) materials. Furthermore, the compound may utilize a relatively bulky and durable azasiline as an electron donating group, which may contribute to increase of emission efficiency and extension of life for the organic electroluminescence device.

The nitrogen-containing compound according to an embodiment of the present disclosure may be applied to a luminescence material emitting blue light having a wavelength range of about less than 470 nm, or, for example, a luminescence material emitting deep blue light having a wavelength range of about 440 nm to about 470 nm, or about 450 nm to about 470 nm, or about 460 nm.

Hereinafter, an organic electroluminescence device according to an embodiment will be explained. The explanation will be mainly given with features different from the nitrogen-containing compound according to an embodiment of the present disclosure, and unexplained parts will follow the above-description regarding the nitrogen-containing compound according to an embodiment of the present disclosure.

An organic electroluminescence device according to an embodiment of the present disclosure includes the above-described nitrogen-containing compound according to an embodiment of the present disclosure.

Figure 2:
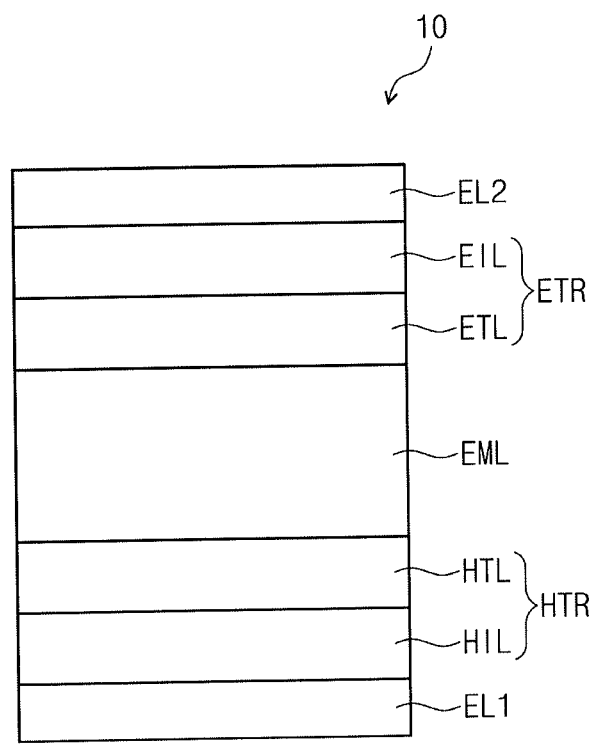
FIG. 2 illustrates a schematic cross-sectional view of an organic electroluminescence device according to an embodiment of the present disclosure.
Figure 3:
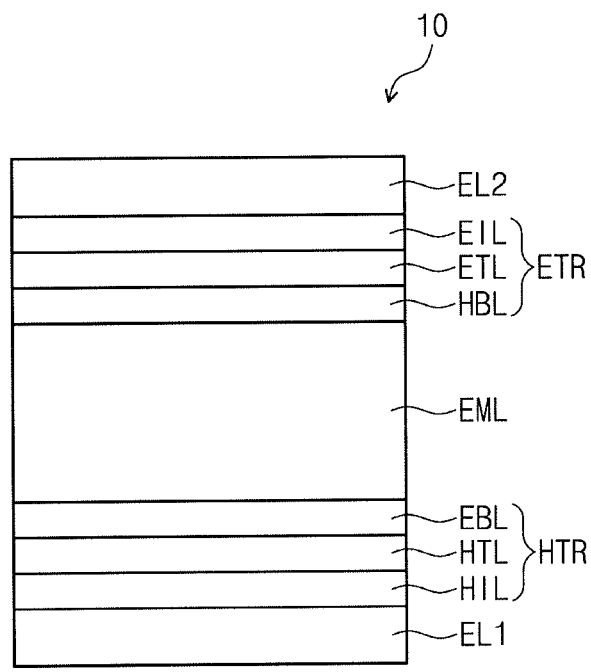
FIG. 3 illustrates a schematic cross-sectional view of an organic electroluminescence device according to an embodiment of the present disclosure.

FIG. 1 illustrates a schematic cross-sectional view of an organic electroluminescence device according to an embodiment of the present disclosure. FIG. 2 illustrates a schematic cross-sectional view of an organic electroluminescence device according to an embodiment of the present disclosure. FIG. 3 illustrates a schematic cross-sectional view of an organic electroluminescence device according to an embodiment of the present disclosure.

Referring to FIGS. 1 to 3, an organic electroluminescence device 10 according to an embodiment of the present disclosure may include a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is a transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some implementations, the first electrode EL1 may have a structure including a plurality of layers including a reflective layer or transflective layer formed using the above materials, and a transparent conductive layer formed using ITO, IZO, ZnO, or ITZO. For example, the first electrode EL1 may have a triple-layer structure of ITO/Ag/ITO.

The thickness of the first electrode EL1 may be from about 1,000 Å to about 10,000 Å, or, for example, from about 1,000 Å to about 3,000 Å.

The hole transport region HTR may be disposed on the first electrode EL1. The hole transport region HTR may include at least one of a hole injection layer HIL, a hole transport layer HTL, a hole buffer layer, or an electron blocking layer EBL.

The hole transport region HTR may be in a form of a single layer formed using a single material, a single layer formed using a plurality of different materials, or a multi-layer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In some implementations, the hole transport region HTR may be a single layer structure formed using a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, laminated in order from the first electrode EL1.

The hole transport region HTR may be formed using a suitable method such as a vacuum deposition method, a spin coating method, a cast method, a Langmuir-Blodgett (LB) method, an inkjet printing method, a laser printing method, or a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), 4,4',4"-tris(N,N-diphenylamino) triphenylamine (TDATA), 4,4',4"-tris{N-(2-naphthyl)-N-phenylamino}-triphenylamine (2-TDATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HU may include, for example, a carbazole derivative such as N-phenyl carbazole, polyvinyl carbazole, a fluorine-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalen-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), etc.

The electron blocking layer EBL may include a suitable electron blocking material. The electron blocking layer EBL may include, for example, a carbazole derivative such as N-phenyl carbazole, polyvinyl carbazole, a fluorine-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl) triphenylamine (TCTA), N,N'-di(naphthalen-1-yl)-N,N'-diphenyl-benzidine (NPD), 4,4'-cyclohexylidene bis[N,N-bis(4-methylphenyl) benzenamine] (TAPC), 4,4'-bis[N,N'-(3-tolyl)amino]-3,3'-dimethylbiphenyl (HMTPD), or mCP, etc. As described above, the electron blocking layer EBL may also include the nitrogen-containing compound according to an embodiment of the present disclosure.

The thickness of the hole transport region HTR may be from about 100 Å to about 10,000 Å, or, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of a quinone derivative, a metal oxide, or a cyano group-containing compound, as examples. For example, the p-dopant may be a quinone derivative such as tetracyanoquino dimethane (TCNQ), or 2,3,5,6-tetrafluoro-tetracyanoquinodimethane (F4-TCNQ), or a metal oxide such as tungsten oxide or molybdenum oxide.

As described above, the hole transport region HTR may further include at least one of a hole buffer layer or an electron blocking layer EBL. The hole buffer layer may compensate an optical resonance distance according to the wavelength of light emitted from the emission layer EML and may increase light emission efficiency. Materials included in the hole transport region HTR may be used as materials included in the hole buffer layer. The electron blocking layer EBL may be a layer that prevents electron injection from the electron transport region ETR into the hole transport region HTR.

The emission layer EML may be disposed on the hole transport region HTR. The thickness of the emission layer EML may be, for example, from about 100 Å to about 1,000 Å, or from about 100 Å to about 300 Å. The emission layer EML may be a single layer formed using a single material, a single layer formed using a plurality of different materials, or a multilayer structure having a plurality of layers formed using a plurality of different materials.

Hereinafter, a case where the nitrogen-containing compound according to an embodiment of the present disclosure is included in the emission layer EML, will be explained, as an example. The nitrogen-containing compound according to an embodiment of the present disclosure may be included in at least one organic layer provided between the first electrode EL1 and the second electrode EL2. For example, the nitrogen-containing compound according to an embodiment of the present disclosure may be included in the hole transport region HTR. For example, the nitrogen-containing compound according to an embodiment of the present disclosure may be included in the hole transport layer HTL or the electron blocking layer EBL.

The emission layer EML may include the nitrogen-containing compound according to an embodiment of the present disclosure. For example, the emission layer EML may include the nitrogen-containing compound represented by the following Formula 1.

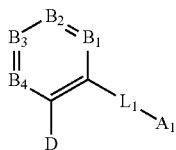

[Formula 1]

In Formula 1, particular explanation of $B_1$ to $B_4$, $L_1$, $A_1$, and D is the same as described above, and the definitions provided above will not be repeated.

The emission layer EML may include one or more of the nitrogen-containing compound represented by Formula 1. The emission layer EML may further include a suitable material in addition to the nitrogen-containing compound represented by Formula 1. For example, the emission layer EML may include a fluorescent material including any one of spiro-DPVBi, 2,2',7,7'-tetrakis(biphenyl-4-yl)-9,9'-spiro-bifluorene(spiro-sexiphenyl) (spiro-6P), distyryl-benzene (DSB), distyryl-arylene (DSA), polyfluorene (PFO)-based polymer and poly(p-phenylene vinylene) (PPV)-based polymer.

The emission layer EML may be a fluorescence-emitting layer. The emission layer EML may emit blue light. The emission layer EML may emit thermally activated delayed fluorescence. For example, the emission layer EML may emit blue light through thermally activated delayed fluorescence. The emission layer EML may emit deep blue light having a wavelength range of about 440 nm to about 470 nm, or about 450 nm to about 470 nm, for example.

The emission layer EML may include a host and a dopant, and the dopant may include the nitrogen-containing compound according to an embodiment of the present disclosure. The emission layer EML may include the nitrogen-containing compound according to an embodiment of the present disclosure as a dopant for thermally activated delayed fluorescence. In this case, the emission layer EML may include at least one of bis[2-(diphenylphosphino)phenyl]ether oxide (DPEPO). 4,4'-bis(carbazol-9-yl)biphenyl (CBP), 1,3-bis(carbazol-9-yl)benzene (mCP), 2,8-bis(diphenylphosphoryl) dibenzo[b,d]furan (PPF), 4,4',4''-tris(carbazol-9-yl)-triphenylamine (TcTa) or 1,3,5-tris(N-phenylbenzimidazol-2-yl)benzene (TPBi), as a host material.

The emission layer EML may further include known host materials, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetrasiloxane (DPSiO4), 2,8-bis(diphenylphosphoryl)dibenzofuran (PPF), etc.

The emission layer EML may further include suitable dopant materials for thermally activated delayed fluorescence in addition to the nitrogen-containing compound according to an embodiment of the present disclosure. For example, the emission layer EML may further include at least one of 10-phenyl-10H,10'H-spiro[acridine-9,9'-anthracen]-10'-one (ACRSA). 3,4,5,6-tetra-9H-carbazol-9-yl-1,2-benzenedicarbonitrile (4CzPN), 2,4,5,6-tetra-9H-carbazol-9-yl-isophthalonitrile (4CzIPN), bis[4-(9,9-dimethyl-9,10-dihydroacridine)phenyl]sulfone (DMAC-DPS), or 2-phenoxazine-4,6-diphenyl-1,3,5-triazine (PSZ-TRZ) as a dopant material. In addition, the emission layer EML may further include suitable dopant materials such as styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-tert-butylperylene (TBP)), pyrene and the derivatives thereof (for example, 1,1-dipyrene, 1,4-dipyrenylbenzene, 1,4-bis(N,N-diphenylamino)pyrene), etc.

The electron transport region ETR may be provided on the emission layer EML. The electron transport region ETR may include, for example, at least one of a hole blocking layer HBL, an electron transport layer ETL or an electron injection layer EIL.

The electron transport region ETR may be in a form of a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some implementations, the electron transport region ETR may have a single layer structure including a plurality of different materials, or a laminated structure of electron transport layer ETL/electron injection layer EIL, or hole blocking layer HBL/electron transport layer ETL/electron injection layer EIL, laminated in order from the emission layer EML, as examples. The thickness of the electron transport region ETR may be, for example, from about 1,000 Å to about 1,500 Å.

The electron transport region ETR may be formed using a suitable method such as a vacuum deposition method, a spin coating method, a cast method, a Langmuir-Blodgett (LB) method, an inkjet printing method, a laser printing method, and a laser induced thermal imaging (LITI) method.

When the electron transport region ETR includes the electron transport layer ETL, the electron transport region ETR may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis [2-(diphenylphosphino)phenyl]ether oxide (DPEPO), 2-(4-(N-phenylbenzoimidazolyl-1-ylphenyl)-9,10-dinaphthylanthracene, 1,3,5-tri(1-phenyl-1H-benzo[d]imidazol-2-yl) phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2, 4-triazole (TAZ), 4-(naphthalen-1-yl)-3,5-diphenyl-4H-1,2, 4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), berylliumbis (benzoquinolin-10-olate) (Bebq2), 9,10-di (naphthalen-2-yl)anthracene (ADN) or a mixture thereof. The thickness of the electron transport layer ETL may be from about 100 Å to about 1,000 Å, or, for example, from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, the electron transport region ETR may include LiF, lithium quinolate (LIQ). $Li_2O$, BaO, NaCl, CsF, a metal such as Yb in the lanthanoide series, or a metal halide such as RbCl and RbI, as examples. In some implementations, the electron injection layer EIL may be formed using a mixture material of an electron transport material and an insulating organo metal salt. The organo metal salt may be a material having an energy band gap of about 4 eV or more. The organo metal salt may include, for example, a metal acetate, a metal benzoate, a metal acetoacetate, a metal acetylacetonate, or a metal stearate. The thickness of the electron injection layer EIL may be from about 1 Å to about 100 Å, or, for example, from about 3 Å to about 90 Å. When the thickness of the electron injection layer EIL satisfies the above described range, satisfactory electron injection properties may be obtained without inducing a substantial increase of the driving voltage.

The electron transport region ETR may include a hole blocking layer HBL, as described above. The hole blocking layer HBL may include, for example, 2,9-dimethyl-4,7-diphenyl-1,10-phenanthroline (BCP), 4,7-diphenyl-1,10-phenanthroline (Bphen), or bis[2-(diphenylphosphino)phenyl]ether oxide (DPEPO).

The second electrode EL2 may be disposed on the electron transport region ETR. The second electrode EL2 may be a common electrode or a cathode. The second electrode EL2 may be a transmissive electrode, a transflective electrode or a reflective electrode. When the second electrode EL2 is a transmissive electrode, the second electrode EL2 may be formed using a transparent metal oxide such as, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO, ITZO, etc.

The second electrode EL2 may be connected with an auxiliary electrode. When the second electrode EL2 is connected with the auxiliary electrode, the resistance of the second electrode EL2 may decrease.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons. Light may be emitted via the transition of the excitons from an excited state to a ground state.

When the organic electroluminescence device 10 is a top emission type, the first electrode EL1 may be a reflective electrode, and the second electrode EL2 may be a transmissive electrode or a transflective electrode. When the organic electroluminescence device 10 is a bottom emission type, the first electrode EL1 may be a transmissive electrode or a transflective electrode, and the second electrode EL2 may be a reflective electrode.

The organic electroluminescence device 10 according to an embodiment of the present disclosure includes the nitrogen-containing compound represented by Formula 1, thereby securing high efficiency and/or a long device life.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

As an example, the nitrogen-containing compound according to an embodiment of the present disclosure may be synthesized as follows.

1. Synthesis of Compound 3

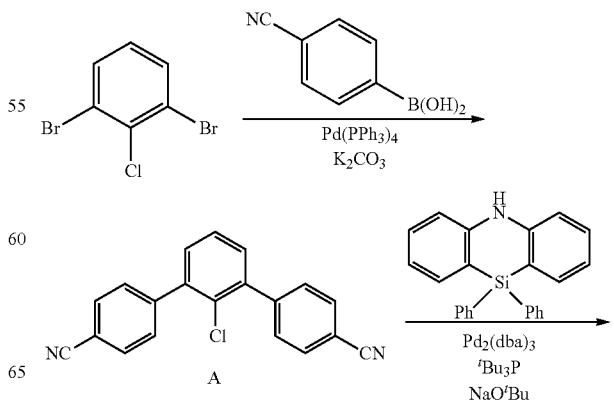

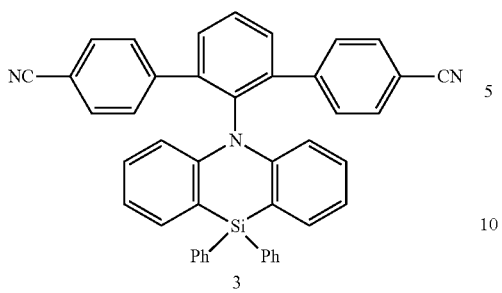
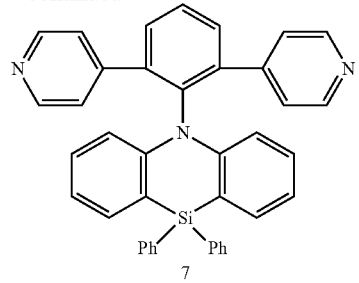

Synthesis of Compound A

Under an argon (Ar) atmosphere, 1,3-dibromo-2-chlorobenzene (8.10 g, 30.0 mmol), 4-cyanophenylboronic acid (8.82 g, 60.0 mmol), Pd(PPh$_3$)$_4$ (0.69 g. 0.6 mmol). K$_2$CO$_3$ (16.6 g, 120.0 mmol), toluene (300 mL) ethanol (60 mL) and water (30 mL) were added to a 1,000 mL three neck flask, and the mixture was stirred at about 100° C. for about 2 hours. After cooling in air, water was added, an organic layer was separated and taken, and solvents were evaporated. The crude product thus obtained was purified by silica gel column chromatography to obtain 7.65 g (yield 81%) of Compound A as a white solid.

The molecular weight of Compound A measured by FAB-MS was 314.

Synthesis of Compound 3

Under an argon (Ar) atmosphere, Compound A (2.55 g, 8.1 mmol), 10,10-diphenyl-5,10-dihydrodibenzo[b,e][1,4]azasiline (2.83 g, 8.1 mmol), Pd$_2$(dba)$_3$ (0.07 g, 0.08 mmol), (t-Bu)$_3$P (0.13 g, 0.65 mmol) and NaOtBu (0.78 g, 8.1 mmol) were added to toluene (40 mL) in a 100 mL three neck flask, and the mixture was stirred at about 120° C. for about 8 hours. After cooling in air, water was added, an organic layer was separated and taken, and solvents were evaporated. The crude product thus obtained was purified by silica gel column chromatography to obtain 3.66 g (yield 72%) of Compound 3 as a white solid.

The molecular weight of Compound 3 measured by FAB-MS was 627. The chemical shift values (δ) of Compound 3 measured by $^1$H-NMR (CDCl$_3$) were 8.20 (2H), 7.85-7.83 (8H), 7.47-7.37 (15H). 7.28 (2H). 7.03 (2H).

2. Synthesis of Compound 7

Synthesis of Compound B

Under an argon (Ar) atmosphere, 1,3-dibromo-2-chlorobenzene (8.10 g, 30.0 mmol), 4-pyridylboronic acid (7.38 g, 60.0 mmol), Pd(PPh$_3$)$_4$ (0.69 g, 0.6 mmol), K$_2$CO$_3$ (16.6 g, 120.0 mmol) and dioxane (300 mL) were added to a 1,000 mL three neck flask, and the mixture was stirred at about 120° C. for about 2 hours. After cooling in the air, water was added, an organic layer was separated and taken, and solvents were evaporated. The crude product thus obtained was purified by silica gel column chromatography to obtain 4.71 g (yield 59%) of Compound B as a white solid.

The molecular weight of Compound B measured by FAB-MS was 266.

Synthesis of Compound 7

Under an argon (Ar) atmosphere, Compound B (1.57 g, 5.9 mmol), 10,10-diphenyl-5,10-dihydrodibenzo[b,e][1,4]azasiline (2.83 g, 8.1 mmol), Pd$_2$(dba)$_3$ (0.05 g, 0.06 mmol), (t-Bu)$_3$P (0.10 g. 0.47 mmol) and NaOtBu (0.57 g, 5.9 mmol) were added to toluene (30 mL) in a 100 mL three neck flask, and the mixture was stirred at about 120° C. for about 8 hours. After cooling in air, water was added, an organic layer was separated and taken, and solvents were evaporated. The crude product thus obtained was purified by silica gel column chromatography to obtain 2.19 g (yield 64%) of Compound 7 as a white solid.

The molecular weight of Compound 7 measured by FAB-MS was 579. The chemical shift values (δ) of Compound 7 measured by $^1$H-NMR (CDCl$_3$) were 8.71 (4H), 8.20 (2H), 8.00 (4H), 7.73 (1H), 7.47-7.37 (15H), 7.28 (2H), 7.03 (2H).

3. Synthesis of Compound 12

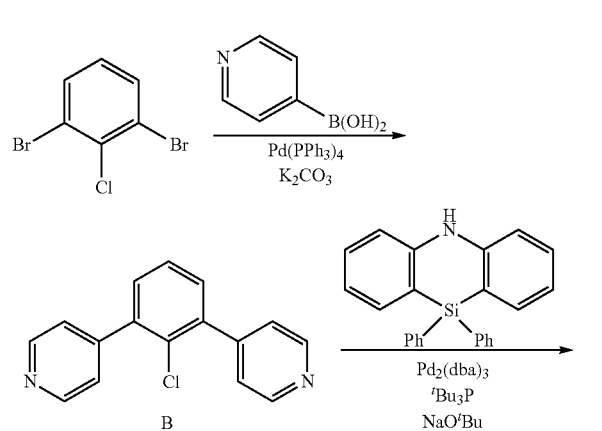
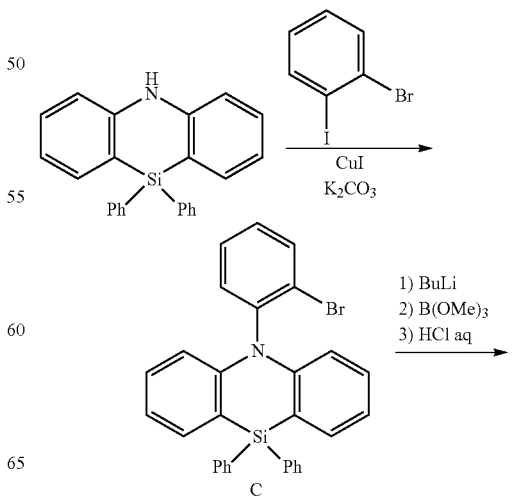

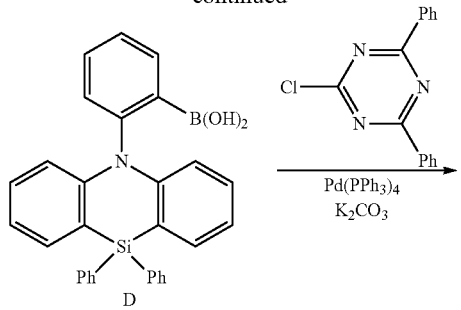

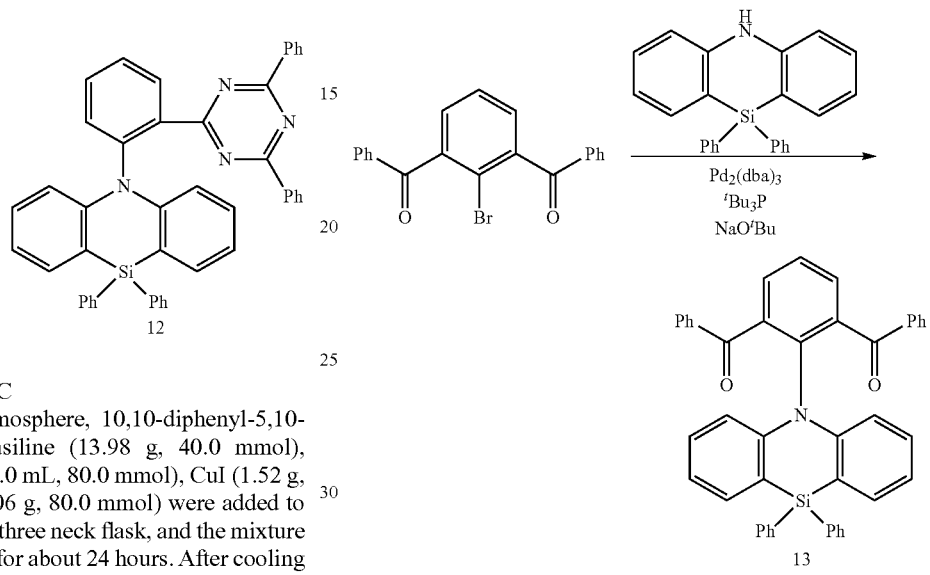

Synthesis of Compound C

Under an argon (Ar) atmosphere, 10,10-diphenyl-5,10-dihydrodibenzo[b,e][1,4]azasiline (13.98 g, 40.0 mmol), 1-bromo-2-iodobenzene (10.0 mL, 80.0 mmol), CuI (1.52 g, 8.0 mmol) and $K_2CO_3$ (11.06 g, 80.0 mmol) were added to xylene (40 mL) in a 200 mL three neck flask, and the mixture was stirred at about 180° C. for about 24 hours. After cooling in air, toluene was added, the mixture was filtered, and solvents were evaporated. The crude product thus obtained was purified by silica gel column chromatography to obtain 7.01 g (yield 34%) of Compound C as a white solid.

The molecular weight of Compound C measured by FAB-MS was 514.

Synthesis of Compound D

Under an argon (Ar) atmosphere. Compound C (7.01 g, 13.6 mmol) dissolved in dehydrated THF (150 mL) was added to a 500 mL three neck flask, followed by stirring at about −78° C. 1.6 M n-butyllithium hexane solution (8.5 mL 13.6 mmol) was added thereto dropwisely, followed by stirring for about 1 hour. Trimethoxyborane (1.7 mL, 5.3 mmol) was added thereto dropwisely, followed by stirring at about −78° C. for about 1 hour. After that, the mixture was stirred at room temperature for about 3 hours. After the reaction, 1N—HCl aqueous solution was added thereto and the mixture was stirred for about 1 hour. The resultant was washed with water. The organic phase thus obtained was concentrated to obtain a viscous material. The crude product thus obtained was purified by silica gel column chromatography to obtain 2.87 g (yield 45%) of Compound D as a white solid.

The molecular weight of Compound D measured by FAB-MS was 469.

Synthesis of Compound 12

Under an argon (Ar) atmosphere, Compound D (2.87 g, 6.1 mmol), 2-chloro-4,6-diphenyl-1,3,5-triazine (1.63 g, 6.1 mmol), Pd(PPh$_3$)$_4$ (0.07 g, 0.06 mmol), $K_2CO_3$ (1.69 g, 12.2 mmol), toluene (30 mL), ethanol (6 mL) and water (3 mL) were added to a 100 mL three neck flask, and the mixture was stirred at about 100° C. for about 2 hours. After cooling in air, water was added, an organic layer was separated and taken, and solvents were evaporated. The crude product thus obtained was purified by silica gel column chromatography to obtain 3.68 g (yield 92%) of Compound 12 as a white solid.

The molecular weight of Compound 12 measured by FAB-MS was 656. The chemical shift values (δ) of Compound 12 measured by $^1$H-NMR (CDCl$_3$) were 8.36 (4H), 7.73 (1H). 7.51-7.36 (22H), 7.28 (2H), 7.16 (1H), 7.03 (2H).

4. Synthesis of Compound 13

Under an argon (Ar) atmosphere, (2-bromo-1,3-phenylene) bis(phenylmethanone) (3.65 g, 10.0 mmol), 10,10-diphenyl-5,10-dihydrodibenzo[b,e][1,4]azasiline (3.49 g, 10.0 mmol), Pd$_2$(dba)$_3$ (0.09 g, 0.1 mmol), (t-Bu)$_3$P (0.16 g, 0.8 mmol) and NaOtBu (0.96 g, 10.0 mmol) were added to toluene (50 mL) in a 200 mL three neck flask, and the mixture was stirred at about 120° C. for about 2 hours. After cooling in air, water was added, an organic layer was separated and taken, and solvents were evaporated. The crude product thus obtained was purified by silica gel column chromatography to obtain 5.00 g (yield 79%) of Compound 13 as a white solid.

The molecular weight of Compound 13 measured by FAB-MS was 633. The chemical shift values (δ) of Compound 13 measured by $^1$H-NMR (CDCl$_3$) were 7.89 (2H), 7.75 (4H), 7.61 (2H), 7.52-7.37 (18H), 7.29-7.19 (3H), 7.03 (2H).

5. Synthesis of Compound 45

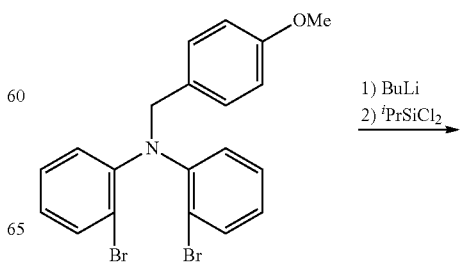

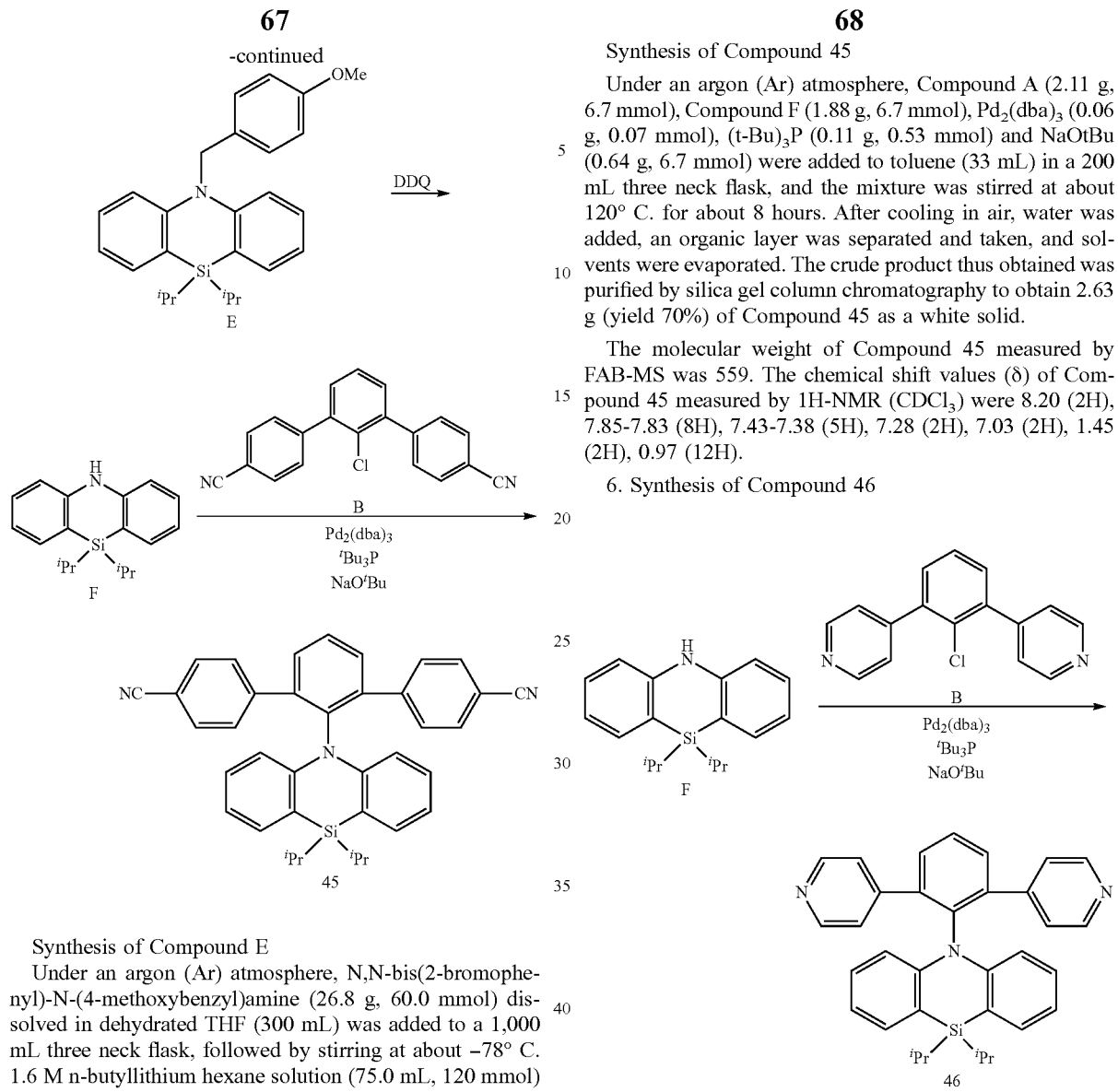

Synthesis of Compound E

Under an argon (Ar) atmosphere, N,N-bis(2-bromophenyl)-N-(4-methoxybenzyl)amine (26.8 g, 60.0 mmol) dissolved in dehydrated THF (300 mL) was added to a 1,000 mL three neck flask, followed by stirring at about −78° C. 1.6 M n-butyllithium hexane solution (75.0 mL, 120 mmol) was added thereto dropwisely, followed by stirring for about 2 hours. Diisopropyldichlorosilane (10.8 mL, 60.0 mmol) was added thereto dropwisely, followed by stirring at about −78° C. for about 2 hours. After that, the mixture was stirred at room temperature for about 3 hours. After the reaction, the resultant was washed with water. The organic phase thus obtained was concentrated to obtain a viscous material. The crude product thus obtained was purified by silica gel column chromatography to obtain 11.1 g (yield 46%) of Compound E as a white solid.

The molecular weight of Compound E measured by FAB-MS was 401.

Synthesis of Compound F

Under an argon (Ar) atmosphere, Compound E (11.1 g, 27.6 mmol), DDQ (6.58 g, 29.0 mmol), toluene (120 mL) and water (12 mL) were added to a 500 mL three neck flask, and the mixture was stirred at about 80° C. for about 14 hours. After that, an organic layer was washed with water, and solvents were evaporated under reduced pressure. The crude product thus obtained was purified by silica gel column chromatography to obtain 3.80 g (yield 49%) of Compound F as a white solid.

The molecular weight of Compound F measured by FAB-MS was 281.

Synthesis of Compound 45

Under an argon (Ar) atmosphere, Compound A (2.11 g, 6.7 mmol), Compound F (1.88 g, 6.7 mmol), $Pd_2(dba)_3$ (0.06 g, 0.07 mmol), $(t-Bu)_3P$ (0.11 g, 0.53 mmol) and NaOtBu (0.64 g, 6.7 mmol) were added to toluene (33 mL) in a 200 mL three neck flask, and the mixture was stirred at about 120° C. for about 8 hours. After cooling in air, water was added, an organic layer was separated and taken, and solvents were evaporated. The crude product thus obtained was purified by silica gel column chromatography to obtain 2.63 g (yield 70%) of Compound 45 as a white solid.

The molecular weight of Compound 45 measured by FAB-MS was 559. The chemical shift values (δ) of Compound 45 measured by 1H-NMR ($CDCl_3$) were 8.20 (2H), 7.85-7.83 (8H), 7.43-7.38 (5H), 7.28 (2H), 7.03 (2H), 1.45 (2H), 0.97 (12H).

6. Synthesis of Compound 46

Synthesis of Compound 46

Under an argon (Ar) atmosphere, Compound B (1.79 g, 6.7 mmol), Compound F (1.88 g, 6.7 mmol), $Pd_2(dba)_3$ (0.06 g, 0.07 mmol), $(t-Bu)_3P$ (0.11 g, 0.53 mmol) and NaOtBu (0.64 g, 6.7 mmol) were added to toluene (33 mL) in a 200 mL three neck flask, and the mixture was stirred at about 120° C. for about 8 hours. After cooling in the air, water was added, an organic layer was separated and taken, and solvents were evaporated. The crude product thus obtained was purified by silica gel column chromatography to obtain 2.06 g (yield 60%) of Compound 46 as a white solid.

The molecular weight of Compound 46 measured by FAB-MS was 511. The chemical shift values (δ) of Compound 46 measured by $^1$H-NMR ($CDCl_3$) were 8.71 (4H), 8.20 (2H), 8.00 (4H), 7.43-7.38 (5H), 7.28 (2H), 7.03 (2H), 1.45 (2H), 0.97 (12H).

Device Manufacturing Example

Organic electroluminescence devices of Examples 1 to 6 were manufactured by using the above Compounds 3, 7, 12, 13, 45 and 46 as a dopant material in an emission layer.

Example Compounds
3
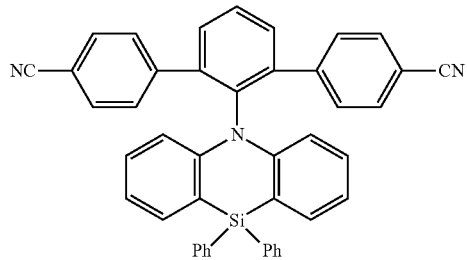
7
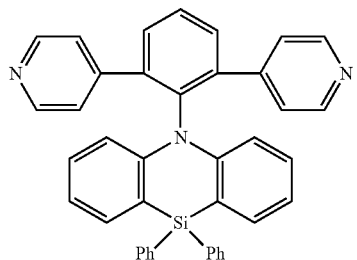
12
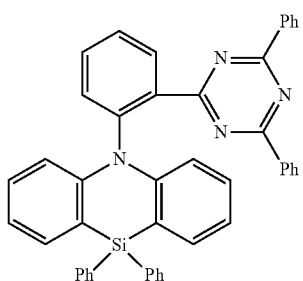
13
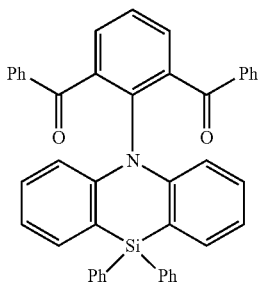
45
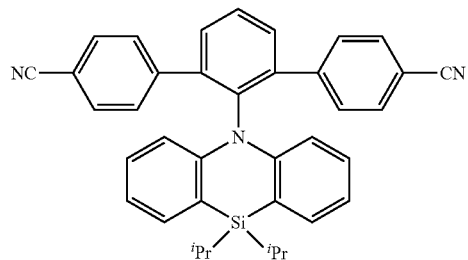
46
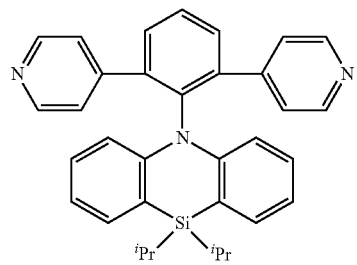
Organic electroluminescent devices of Comparative Examples 1 to 4 were manufactured by using the following Comparative Compounds c1 to c4.
Comparative Compounds
c1
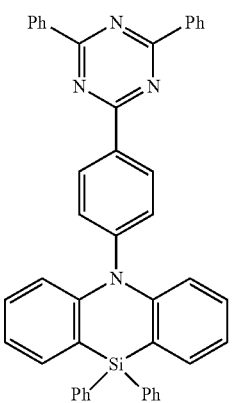
c2
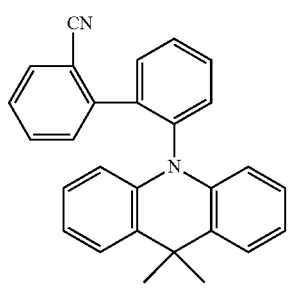
c3
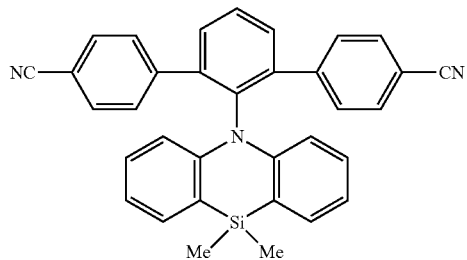

-continued c4

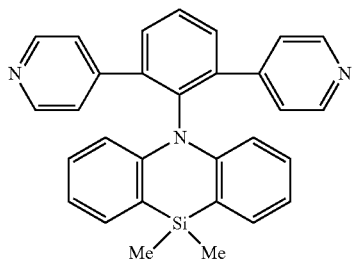

The organic electroluminescence devices according to Examples 1 to 6 and Comparative Examples 1 to 4 were manufactured by forming a first electrode using ITO to a thickness of about 120 nm, a hole injection layer using HAT-CN to a thickness of about 10 nm, a hole transport layer using α-NPD to a thickness of about 80 nm, an electron blocking layer using mCP to a thickness of about 5 nm, an emission layer using DPEPO doped with the example compounds or the comparative compounds in an amount of 20% to a thickness of about 20 nm, a hole blocking layer using DPEPO to a thickness of about 10 nm, an electron transport layer using TPBi to a thickness of about 30 nm, an electron injection layer using LiF to a thickness of about 0.5 nm, and a second electrode using Al to a thickness of about 100 nm. Each layer was formed by a vacuum deposition method.

TABLE 1

|  | Dopant material in emission layer | EQE (%) | Life LT50 (h) |
|---|---|---|---|
| Example 1 | Example Compound 3 | 11.4 | 8.1 |
| Example 2 | Example Compound 7 | 11.9 | 7.2 |
| Example 3 | Example Compound 12 | 12.3 | 33.4 |
| Example 4 | Example Compound 13 | 15.6 | 19.1 |
| Example 5 | Example Compound 45 | 11.0 | 4.5 |
| Example 6 | Example Compound 46 | 11.6 | 4.2 |
| Comparative Example 1 | Comparative Compound c1 | 9.8 | 15.4 |
| Comparative Example 2 | Comparative Compound c2 | 6.9 | 1.9 |
| Comparative Example 3 | Comparative Compound c3 | 10.2 | 2.1 |
| Comparative Example 4 | Comparative Compound c4 | 10.8 | 1.8 |

In the above Table 1, "Life LT50" refers to time required for a luminance half-time from an initial luminance of 100 cd/cm², and "EQE" means external quantum efficiency at 10 mA/cm².

Referring to the results in Table 1, it may be found that the organic electroluminescence devices of Examples 1 to 6 have enhanced efficiency and/or extended life when compared with those of Comparative Examples 1 to 4. For example, it may be seen that the organic electroluminescence devices of Examples 1 to 6 using example compounds with an electron accepting group and an electron donating group which is an azasiline derivative substituted in an ortho position, in which distortion of an electron accepting group and an electron donating group due to steric hindrance decreases an $\Delta$EST value (the difference between the lowest excitation singlet energy level (S1) and the lowest excitation triplet energy level (T1)), thereby promoting reverse intersystem crossing, in which a triplet converts to a singlet, have enhanced efficiency when compared with that of organic electroluminescence devices of Comparative Example 1 using Comparative Compound c1 with an electron accepting group and an electron donating group substituted in para position. In addition, the organic electroluminescence devices of Examples 3 and 4 have extended device life, when compared with organic luminescence devices of Comparative Example 1. It may be seen that the organic electroluminescence device of Comparative Example 2 using Comparative Compound c2 with an acridane group as an electron donating group, which has decreased molecular durability compared with azasiline and increased roll-off, has shorter device life when compared with the organic electroluminescence devices of Examples 1 to 6.

Comparing Examples 5 and 6 with Comparative Examples 3 and 4, the organic electroluminescence devices of Examples 5 and 6 using example compounds, in which a relatively bulky isopropyl group is substituted at Si of azasiline, have enhanced efficiency and extended life when compared with those of Comparative Examples 3 and 4, in which a methyl group is substituted at Si of azasiline. It is believed that the result is due to the improved molecular durability by the introduction of a relatively bulky substituent. It may also be found that, comparing Example 2 with Comparative Example 4, the introduction of a bulky phenyl group at Si of azasiline results in extended device life.

The organic electroluminescence devices of Examples 1 to 4, in which electron accepting groups are bulkier than those of Examples 5 and 6, thereby increasing distortion of molecular structure and decreasing EST value, are shown to have favorable efficiency and device life.

By way of summation and review, in the use of an organic electroluminescence device in a display, a decrease of a driving voltage, an increase of emission efficiency and an extension of life for the organic electroluminescence device are desirable. The continuous development of materials that may stably implement these requirements in the organic electroluminescence device is also desirable.

Research relating to phosphorescence emission using triplet state energy or delayed fluorescence emission using triplet-triplet annihilation (TTA) in which singlet excitons are generated by the collision of triplet excitons is being conducted for achieving a high efficiency organic electroluminescence device. In addition, thermally activated delayed fluorescence (TADF) materials using delayed fluorescence phenomenon are being developed.

The nitrogen-containing compound according to an embodiment of the present disclosure is advantageous in terms of efficiency and/or device life. The nitrogen-containing compound according to an embodiment of the present disclosure may have an effect of enhanced efficiency and device life, and may attain blue light emitting.

The nitrogen-containing compound according to an embodiment of the present disclosure may be used as a material for an organic layer of an organic electroluminescence device, and therefore an enhanced efficiency and an extended life of the organic electroluminescence device may be attained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A nitrogen-containing compound represented by the following Formula 1:

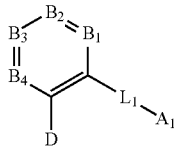

[Formula 1]

wherein in Formula 1, $B_1$ to $B_4$ are each independently N or $CR_1$, $R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group consisting of 2 to 30 ring carbon atoms and at least one of O, N, P or S as a heteroatom, $L_1$ is a direct linkage, a substituted or unsubstituted arylene group having 6 to 50 ring carbon atoms, or a substituted or unsubstituted heteroarylene group having 2 to 50 ring carbon atoms, $A_1$ is an electron accepting group, and D is an electron donating group represented by the following Formula 2:

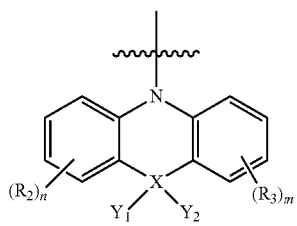

[Formula 2]

wherein in Formula 2,

X is Si or Ge, $Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms, $R_2$ and $R_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and n and m are each independently an integer of 0 to 4, and wherein $A_1$ is a substituted or unsubstituted triazine group, or a substituted or unsubstituted carbonyl group-containing moiety.

2. A nitrogen-containing compound represented by the following Formula 1:

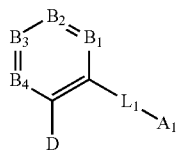

[Formula 1]

wherein in Formula 1, $B_1$ to $B_4$ are each independently N or $CR_1$, $R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group having 2 to 30 ring carbon atoms, $L_1$ is a direct linkage, a substituted or unsubstituted arylene group having 6 to 50 ring carbon atoms, or a substituted or unsubstituted heteroarylene group having 2 to 50 ring carbon atoms, $A_1$ is an electron accepting group, D is an electron donating group represented by the following Formula 2:

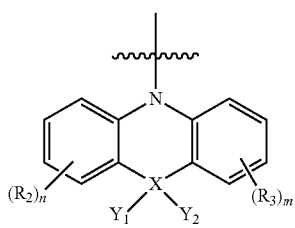

[Formula 2]

wherein in Formula 2,

X is Si or Ge, $Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms, R$_2$ and R$_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and n and m are each independently an integer of 0 to 4, wherein the nitrogen-containing compound represented by Formula 1 is a nitrogen-containing compound represented by the following Formula 1-1:

[Formula 1-1]

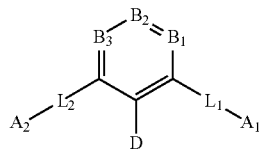

wherein Formula 1-1,

L$_2$ is a direct linkage, a substituted or unsubstituted arylene group having 6 to 50 ring carbon atoms, or a substituted or unsubstituted heteroarylene group having 2 to 50 ring carbon atoms, A$_2$ is an electron accepting group, and L$_1$, B$_1$ to B$_3$ and D are the same as defined in connection with Formula 1, and wherein A$_1$ is a substituted or unsubstituted triazine group, or a substituted or unsubstituted carbonyl group-containing moiety.

3. The nitrogen-containing compound as claimed in claim 2, wherein A$_2$ is a cyano group, a fluorine atom, a fluoroalkyl group, a fluoroaryl group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, or a substituted or unsubstituted heteroaryl group including nitrogen, or represented by the following Formula 3:

[Formula 3]

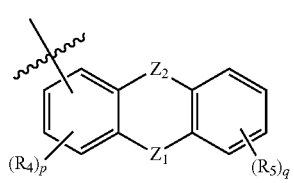

wherein in Formula 3,

Z$_1$ is —SO—, —SO$_2$—, —BR$_6$—,

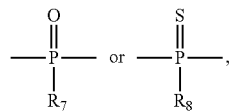

Z$_2$ is O, S, or NAr,

Ar is a substituted or unsubstituted aryl group having 6 to 30 ring carbon atoms, or a substituted or unsubstituted heteroaryl group having 2 to 30 ring carbon atoms, R$_6$ to R$_8$ are each independently a substituted or unsubstituted alkyl group having 1 to 20 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, R$_4$ and R$_5$ are each independently a hydrogen atom, a deuterium atom, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, p is an integer of 0 to 3, and q is an integer of 0 to 4.

4. The nitrogen-containing compound as claimed in claim 1, wherein Y$_1$ and Y$_2$ are each independently a substituted or unsubstituted phenyl group, or a substituted or unsubstituted isopropyl group.

5. The nitrogen-containing compound as claimed in claim 4, wherein Y$_1$ and Y$_2$ are the same as each other.

6. The nitrogen-containing compound as claimed in claim 1, wherein A$_1$ is a group represented by any one of the following formulae:

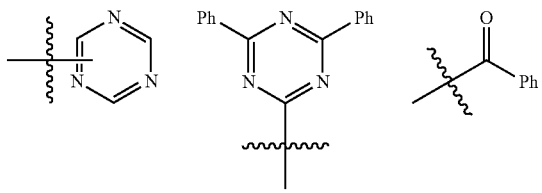

where Ph indicates a phenyl group.

7. The nitrogen-containing compound as claimed in claim 1, wherein L$_1$ is a direct linkage, a substituted or unsubstituted phenylene group, or a substituted or unsubstituted divalent biphenylene group.

8. The nitrogen-containing compound as claimed in claim 1, wherein a number of N in B$_1$ to B$_4$ is 0 or 1.

9. The nitrogen-containing compound as claimed in claim 1, wherein the nitrogen-containing compound represented by Formula 1 has an absolute value of a difference between the lowest excitation singlet energy level (S1) and the lowest excitation triplet energy level (T1) of about 0.2 eV or less.

10. A nitrogen-containing compound selected from the following Compound Group 1:
[Compound Group 1]
1
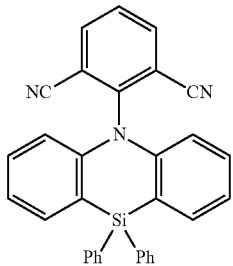
2
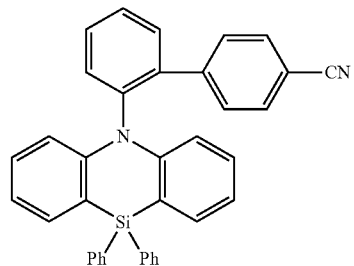
3
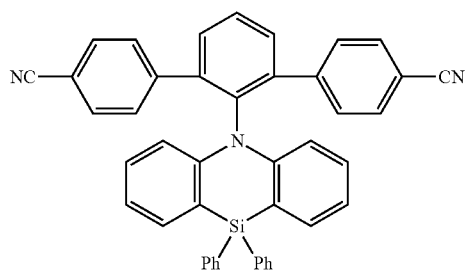
4
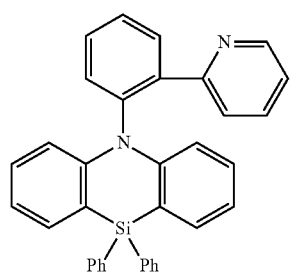
5
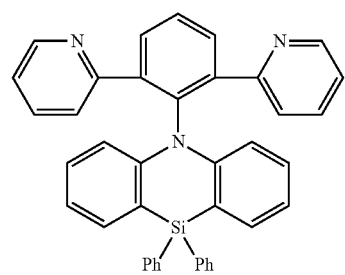
-continued
6
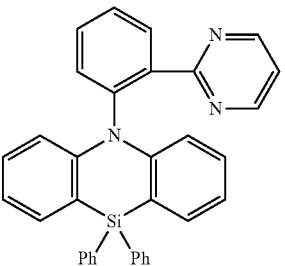
7
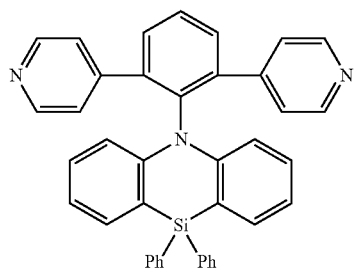
8
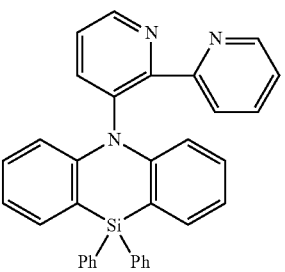
9
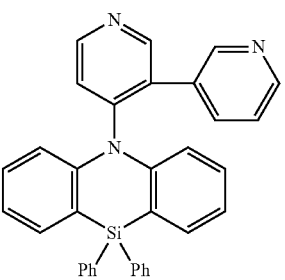
10

-continued
11
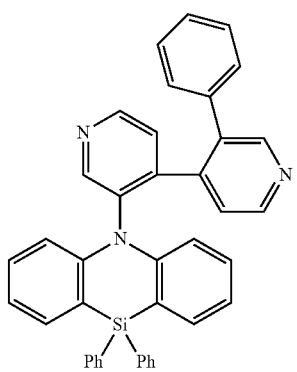
12
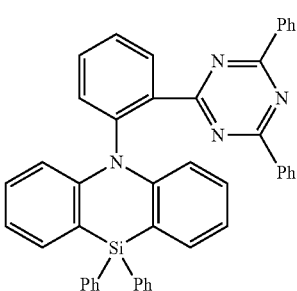
13
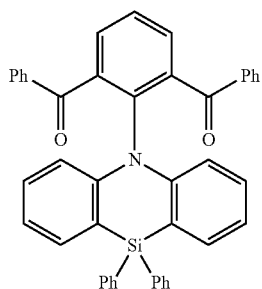
14
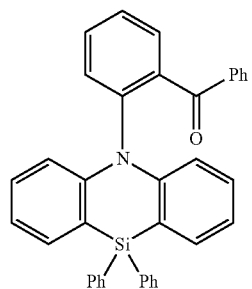
15
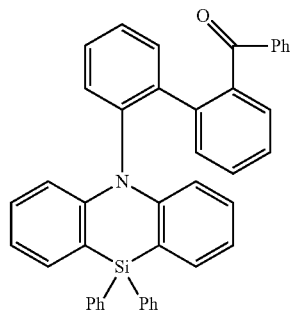
-continued
16
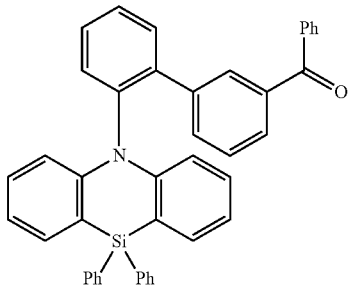
17
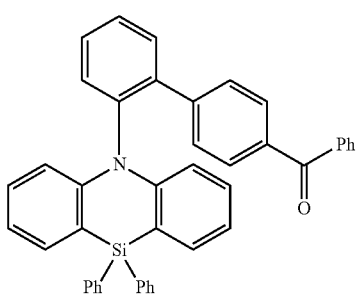
18
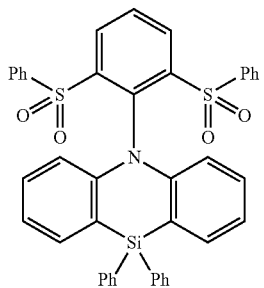
19
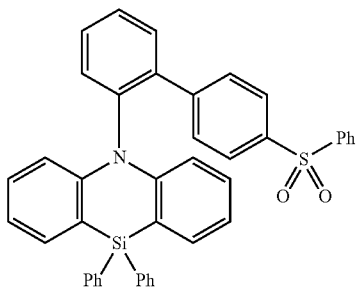
20
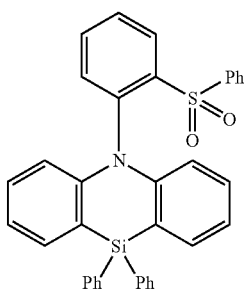

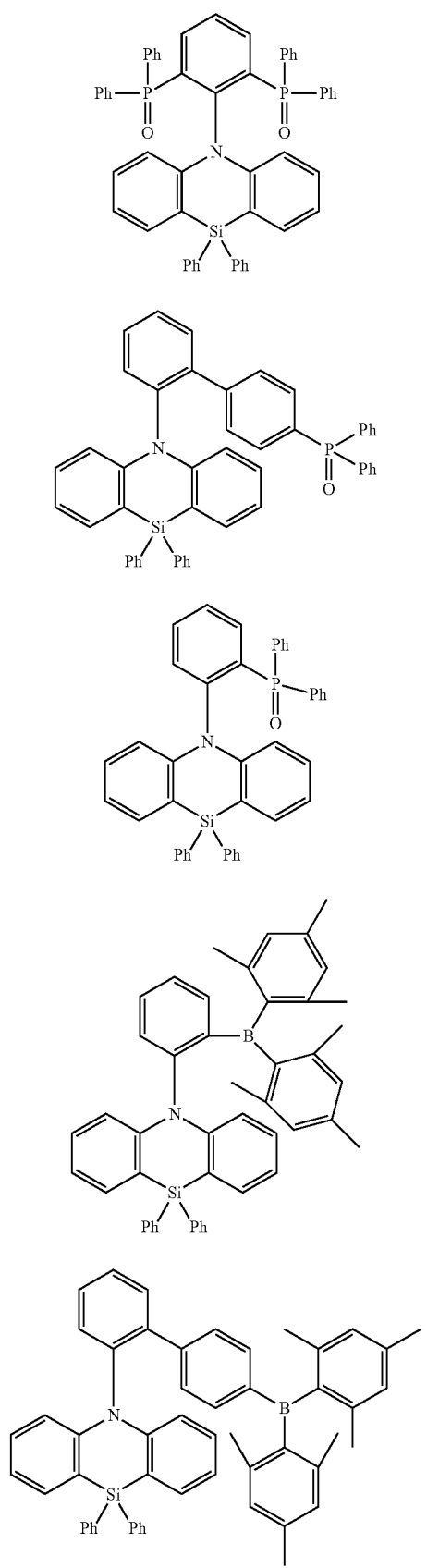
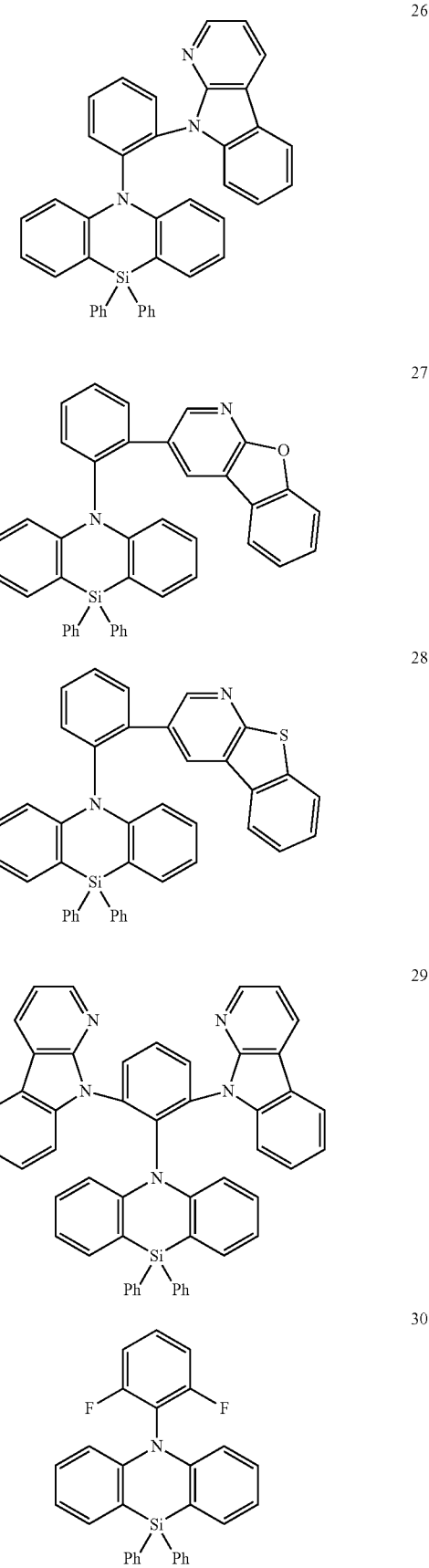

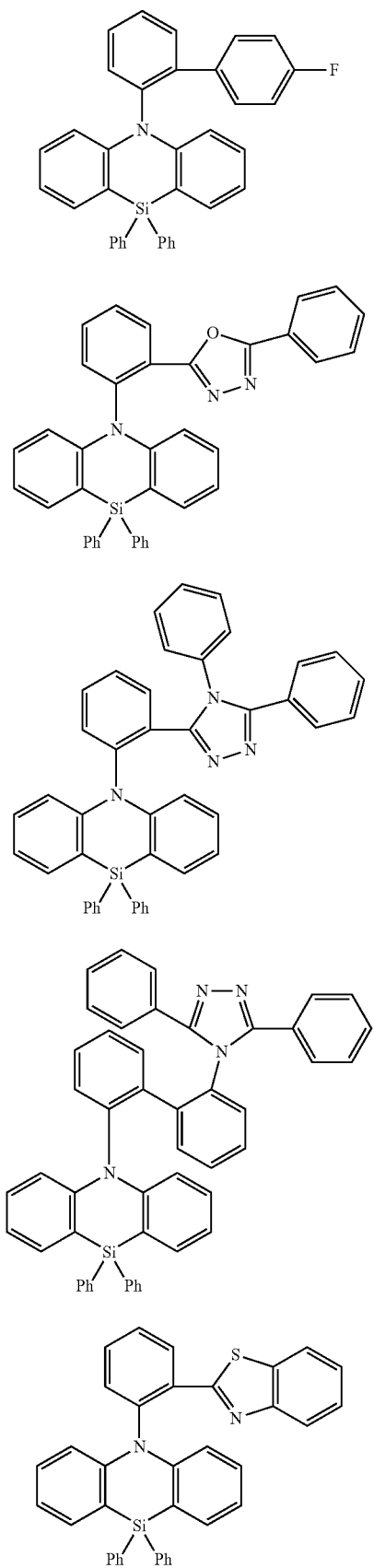
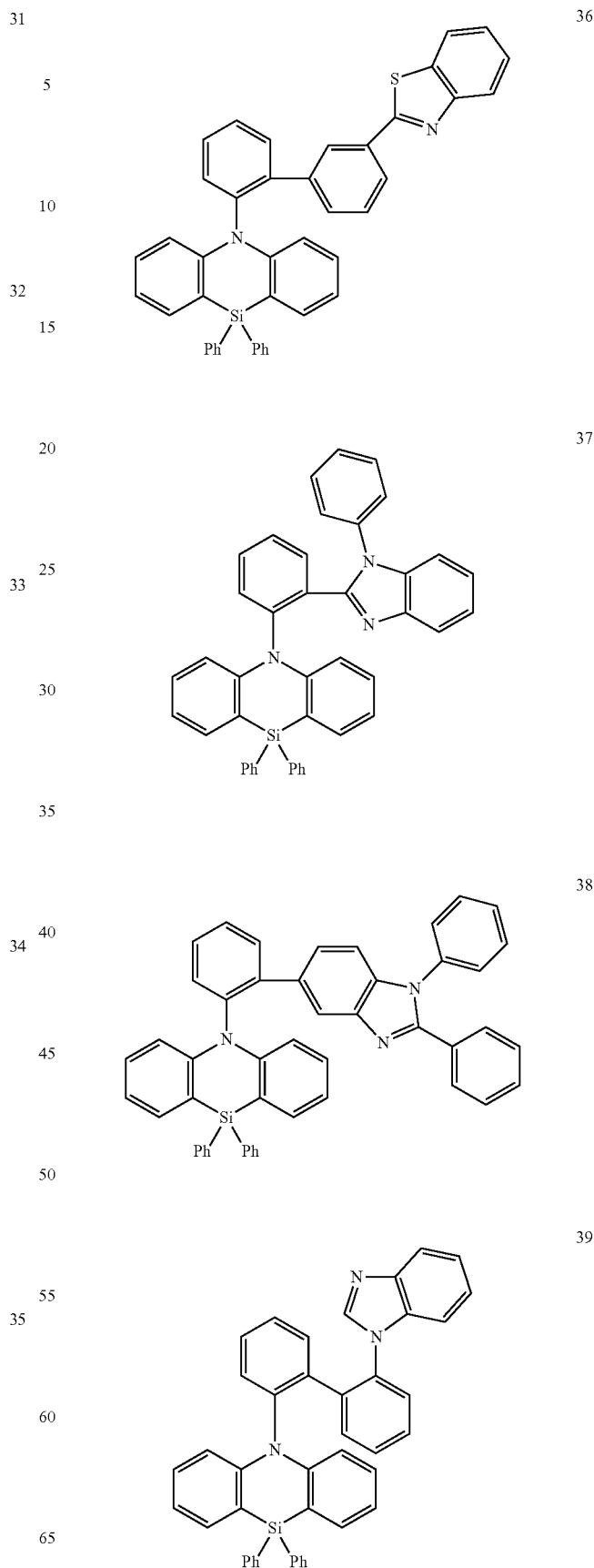

-continued
40
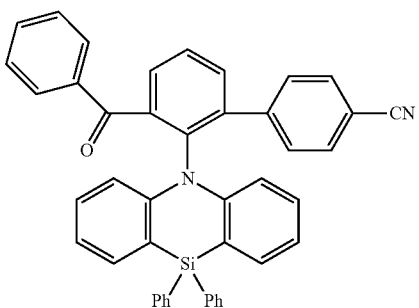
41
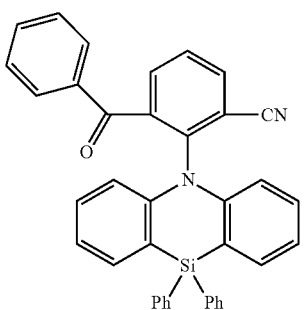
42
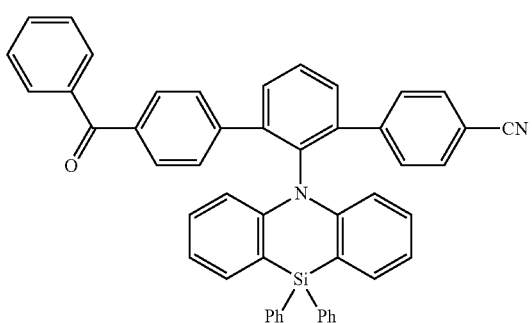
43
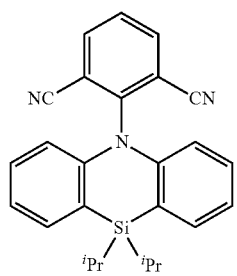
44
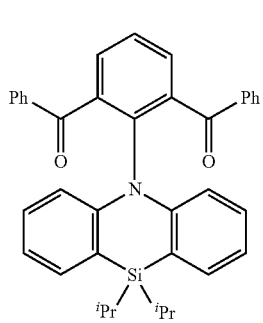
-continued
45
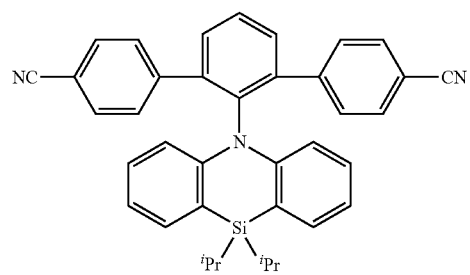
46
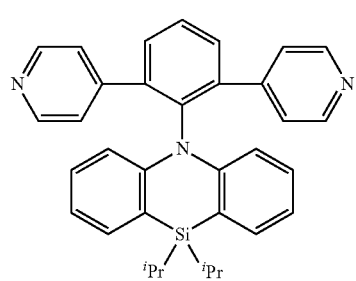
47
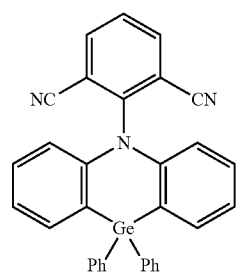
48
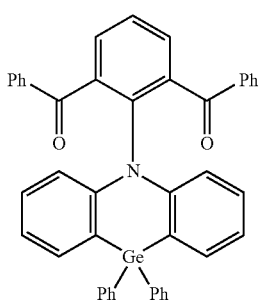
49
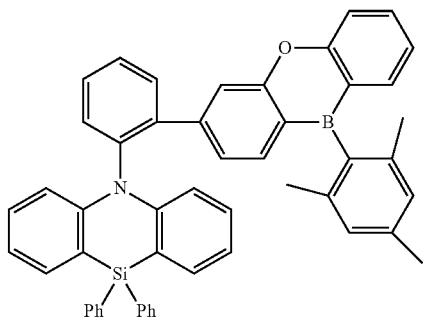

50
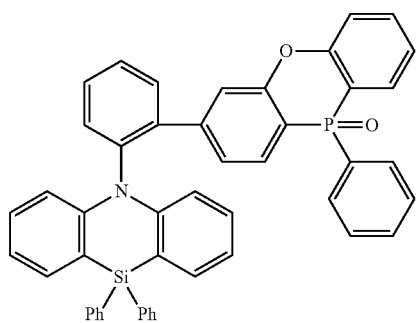
51
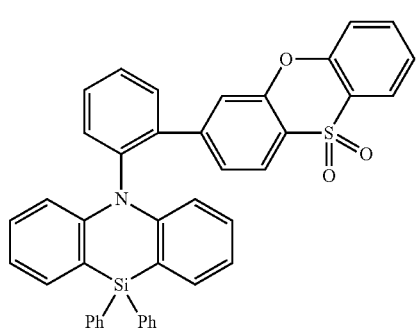
52
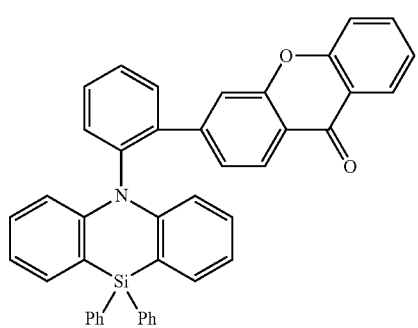
53
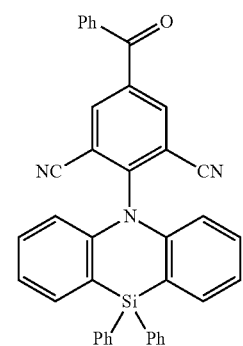
54
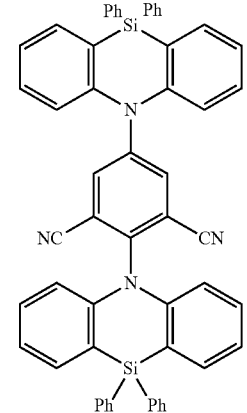
55
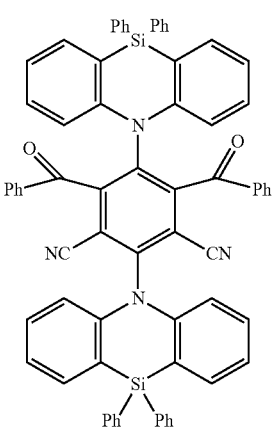
56
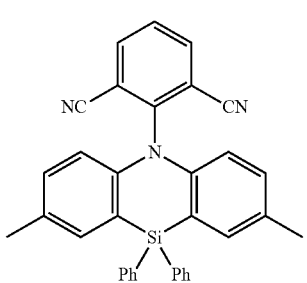
57
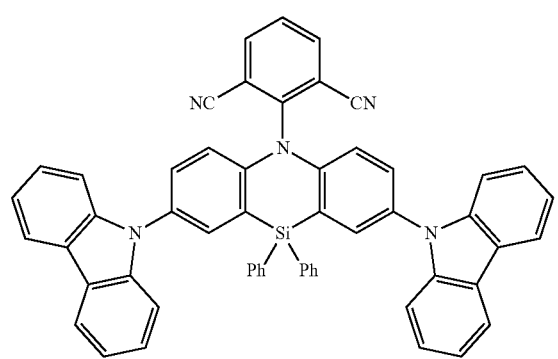

-continued

58

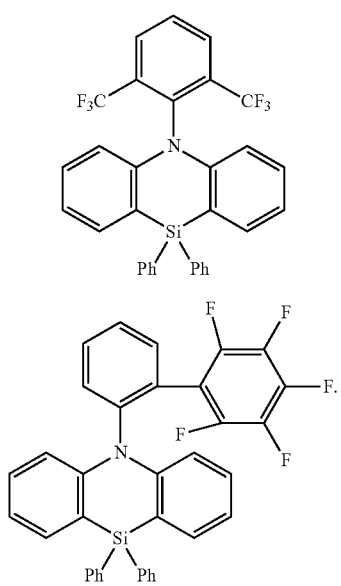

59

11. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more selected from them, a mixture of two or more selected from them, and an oxide thereof,
wherein the emission layer includes a nitrogen-containing compound represented by the following Formula 1:

[Formula 1]

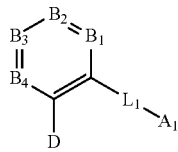

wherein in Formula 1,
$B_1$ to $B_4$ are each independently N or $CR_1$,
$R_1$ is a hydrogen atom, a deuterium atom, a halogen atom, a cyano group, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxide group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heterocycle group consisting of 2 to 30 ring carbon atoms and at least one of O, N, P or S as a heteroatom, $L_1$ is a direct linkage, a substituted or unsubstituted arylene group having 6 to 50 ring carbon atoms, or a substituted or unsubstituted heteroarylene group having 2 to 50 ring carbon atoms,
$A_1$ is an electron accepting group,
D is an electron donating group represented by the following Formula 2:

[Formula 2]

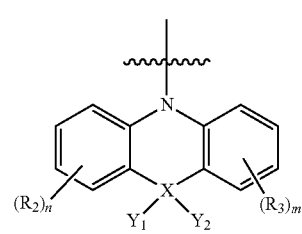

wherein in Formula 2,
X is Si or Ge,
$Y_1$ and $Y_2$ are each independently a substituted or unsubstituted alkyl group having 3 to 20 carbon atoms, a substituted or unsubstituted aralkyl group having 7 to 50 carbon atoms, a substituted or unsubstituted aryl group having 6 to 50 ring carbon atoms, or a substituted or unsubstituted heteroaryl group having 2 to 50 ring carbon atoms,
$R_2$ and $R_3$ are each independently a hydrogen atom, a deuterium atom, a substituted or unsubstituted alkyl group having 1 to 10 carbon atoms, a substituted or unsubstituted amino group, a substituted or unsubstituted alkoxy group, a substituted or unsubstituted aryloxy group, a substituted or unsubstituted alkylthio group, a substituted or unsubstituted arylthio group, a substituted or unsubstituted boryl group, a substituted or unsubstituted carbonyl group, a substituted or unsubstituted sulfoxy group, a substituted or unsubstituted sulfonyl group, a substituted or unsubstituted phosphine oxide group, a substituted or unsubstituted phosphine sulfide group, a substituted or unsubstituted aralkyl group having 6 to 30 ring carbon atoms, a substituted or unsubstituted aryl group having 6 to 30 ring carbon atoms, or a substituted or unsubstituted heteroaryl group having 2 to 30 ring carbon atoms, and
n and m are each independently an integer of 0 to 4, and
wherein $A_1$ is a substituted or unsubstituted triazine group, or a substituted or unsubstituted carbonyl group-containing moiety.

12. The organic electroluminescence device as claimed in claim 11, wherein the nitrogen-containing compound represented by Formula 1 is a nitrogen-containing compound represented by the following Formula 1-1:

[Formula 1-1]

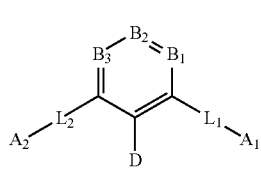

wherein in Formula 1-1,
$L_2$ is a direct linkage, a substituted or unsubstituted arylene group having 6 to 50 ring carbon atoms, or a substituted or unsubstituted heteroarylene group having 2 to 50 ring carbon atoms,
$A_2$ is an electron accepting group, and
$B_1$ to $B_3$ and D are the same as defined in claim 11.

13. The organic electroluminescence device as claimed in claim 11, wherein $Y_1$ and $Y_2$ are each independently a substituted or unsubstituted phenyl group, or a substituted or unsubstituted isopropyl group.

14. The organic electroluminescence device as claimed in claim 11, wherein $A_1$ is a group represented by any one of the following formulae:

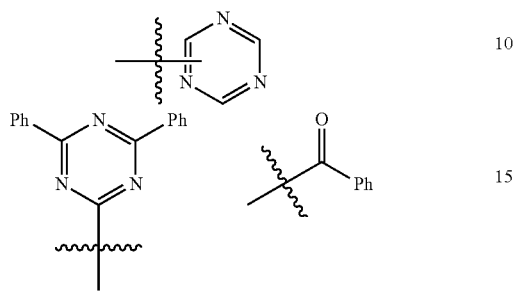

where Ph indicates a phenyl group.

15. The organic electroluminescence device as claimed in claim 11, wherein the emission layer is to emit thermally activated delayed fluorescence.

16. The organic electroluminescence device as claimed in claim 11, wherein the nitrogen-containing compound represented by Formula 1 is at least one compound selected from compounds represented in the following Compound Group 1:

[Compound Group 1]

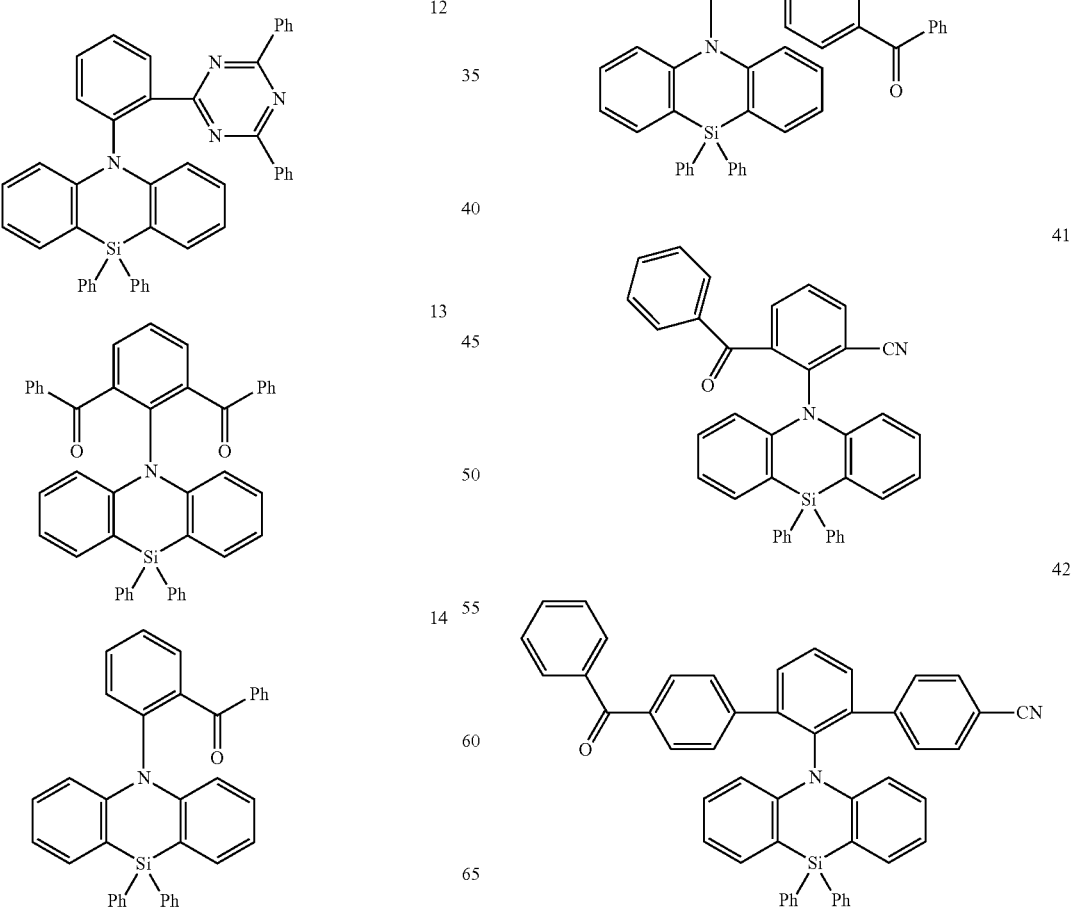

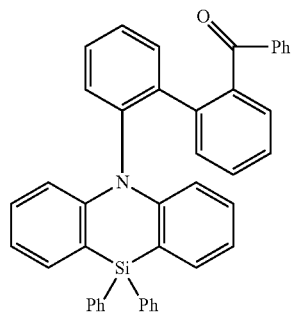

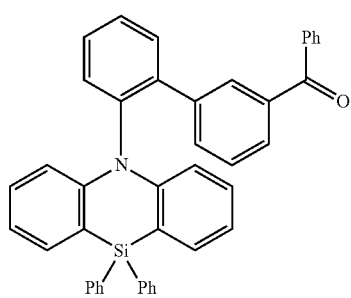

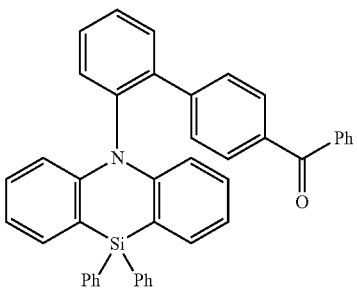

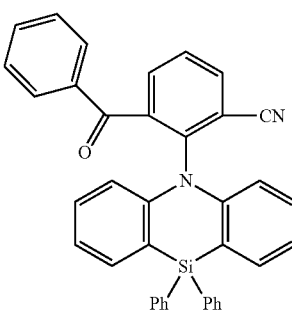

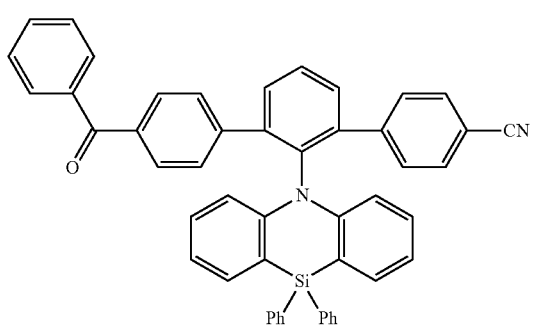

44
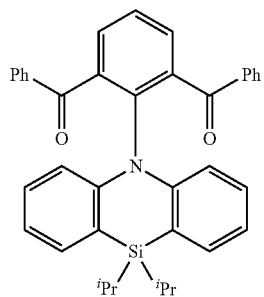
48
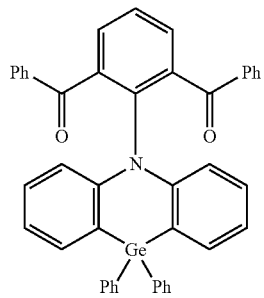
53
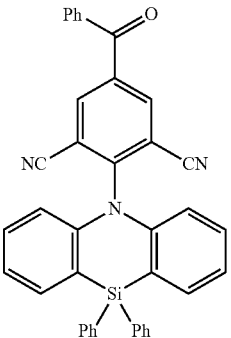
55
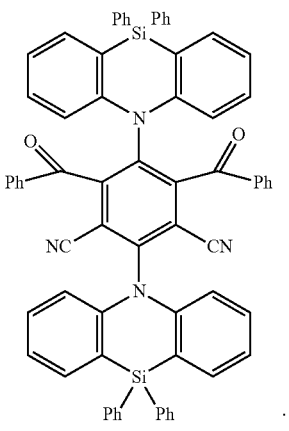
* * * * *